(12) United States Patent
Shizuno

(10) Patent No.: US 7,053,486 B2
(45) Date of Patent: May 30, 2006

(54) SEMICONDUCTOR DEVICE WITH IMPROVED DESIGN FREEDOM OF EXTERNAL TERMINAL

(75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/697,015

(22) Filed: Oct. 31, 2003

(65) Prior Publication Data

US 2004/0089957 A1    May 13, 2004

(30) Foreign Application Priority Data

Nov. 8, 2002    (JP)    ............................ 2002/325770

(51) Int. Cl.
*H01L 23/42* (2006.01)
*H01L 23/52* (2006.01)
*H01L 29/40* (2006.01)

(52) U.S. Cl. ...................... 257/737; 257/738; 257/780; 257/787; 257/774

(58) Field of Classification Search ................ 257/780, 257/737, 738, 787, 774
See application file for complete search history.

(56) References Cited

U.S. PATENT DOCUMENTS

| | | | |
|---|---|---|---|
| 5,739,585 A * | 4/1998 | Akram et al. ................ | 257/698 |
| 6,268,648 B1 * | 7/2001 | Fukutomi et al. ........... | 257/678 |
| 6,271,469 B1 * | 8/2001 | Ma et al. ..................... | 174/52.4 |
| 6,455,920 B1 | 9/2002 | Fukasawa et al. | |
| 2002/0192867 A1 | 12/2002 | Nishiyama | |

FOREIGN PATENT DOCUMENTS

| | | |
|---|---|---|
| JP | 11251493 A | 9/1999 |
| JP | 2000-124354 | 4/2000 |
| JP | 2000208556 A | 7/2000 |
| JP | 2000277682 A | 10/2000 |
| JP | 2001-308116 | 11/2001 |
| JP | 2002-16173 | 1/2002 |
| JP | 2002-231854 | 8/2002 |

* cited by examiner

*Primary Examiner*—Nitin Parekh
(74) *Attorney, Agent, or Firm*—Rabin & Berdo, PC

(57) ABSTRACT

A semiconductor device comprises a base frame having a first surface and a second surface which opposes the first surface, and having an opening portion a semiconductor chip 30 which includes a first main surface on which a plurality of electrode pads is provided and a second main surface, and which is disposed within the opening portion; an insulating film formed on the first surface and first main surface; a plurality of wiring patterns which extend from the electrode pads, respectively to the upper side of the first surface of the base frame, respectively; a sealing portion formed on the wiring patterns and insulating film; and a plurality of external terminals provided on the wiring patterns in a region including the upper side of the base frame.

12 Claims, 19 Drawing Sheets

SEMICONDUCTOR DEVICE WITH IMPROVED DESIGN FREEDOM OF EXTERNAL TERMINAL

BACKGROUND OF THE INVENTION

1. Field of the Invention

This invention relates to a semiconductor device, and more particularly to a semiconductor device in which the degree of design freedom of an external terminal is increased in accordance with further increases in the number of external terminals.

2. Description of Related Art

Demands have been made in recent years for further reductions in the size and thickness of packaged semiconductor devices. In response to such demands, a packaging form known as a Wafer Level Chip Size Package (to be referred to simply as WCSP hereinafter), in which the external size of the packaging is substantially equal to the external size of the semiconductor chip, has been proposed.

A WCSP comprises a semiconductor chip. The semiconductor chip comprises a circuit element having a predetermined function and a plurality of electrode pads electrically connected to each other on the circuit element. An insulating film is formed on the surface of the semiconductor chip such that the plurality of electrode pads is exposed.

A plurality of wiring patterns connected to the exposed electrode pads is formed on the surface of the insulating film.

Electrode posts are formed on these wiring patterns. A sealing portion is then formed so as to cover the insulating film and wiring patterns and such that the top surface of the electrode posts is exposed.

A plurality of external terminals provided as solder balls used in BGA packaging, for example, is provided on the top surface of the electrode posts.

This type of WCSP has a so-called fan-in configuration in which the multiple external terminals are provided in a lattice formation, for example, in a region corresponding to a circuit-forming surface of the semiconductor chip.

As regards the mounting of the semiconductor chip comprising the external terminals in a fan-in configuration onto a printed board, Japanese Patent Application Laid-Open Publication No. 2000-208556 discloses a semiconductor device having the aim of preventing the breakage of a connecting portion between the printed board and external electrodes and comprising a semiconductor chip having electrode pads, wiring which is formed in a predetermined position on the semiconductor chip and connected to the electrode pads, external electrodes which are formed in a predetermined position on the wiring and connected to the wiring, a printed board connected to the external electrodes, and a substrate which is formed on the semiconductor chip. A resin layer is provided on the substrate for aligning the thermal expansion of the substrate and printed board, and in particular the external electrodes are provided on the resin layer.

Further, a semiconductor device having a constitution in which the back surfaces of two WCSP-type semiconductor devices having a so-called fan-in configuration are joined to each other via an adhesive layer is known as a device for increasing compactness and integration while preventing warping of the semiconductor chip.

According to the constitution of the semiconductor device disclosed in Japanese Patent Application Laid-Open Publication No.2000-277682, for example, a sealing resin layer is formed on the outer surface of two joined semiconductor chips, or in other words an electronic circuit forming surface. Conductive posts are formed vertically through the sealing resin layer. These conductive posts are electrically connected to an electronic circuit via a rewiring circuit. Solder bumps are formed on the top surface of the conductive posts:

As semiconductor devices become increasingly sophisticated, the number of external terminals formed on a single packaged semiconductor device is gradually increasing. Conventionally, such demands for increases in the number of external terminals have been met by providing constitutions in which the spacing between adjacent external terminals is narrowed. As shall be described below, however, design freedom is severely restricted by the disposal pitch and disposal positions of external terminals.

In the conventional WCSP described above, the minimum gap between adjacent external terminals is set at a concrete level of approximately 0.5 mm. In the case of a 7 mm×7 mm WCSP, the number of external terminals provided is approximately 160.

In accordance with demands for further increases in the number of external terminals on a packaged semiconductor device, it is desirable that approximately 300 external terminals be provided on a 7 mm×7 mm WCSP.

It is not technically impossible in the aforementioned WCSP to form an even larger number of external terminals on the surface of the WCSP by further narrowing the gap between adjacent external terminals.

However, it is extremely difficult to form 300 external terminals on the surface area of a 7 mm×7 mm WCSP. Moreover, if the intervals between the external terminals are narrowed, an extremely high degree of technology is required to mount the WCSP onto a mounting substrate.

For example, the intervals between the plurality of external terminals may have to be formed in alignment with the mounting pitch of the mounting substrate within a range of approximately 0.3 mm to 0.7 mm.

In a conventional packaging constitution in such a case, a semiconductor chip is connected to the substrate by means of a so-called flip chip connection and the semiconductor chip is connected to the external electrodes via the substrate. Alternatively, the substrate and semiconductor chip are connected by wire bonding and the semiconductor chip is connected to the external electrode via the substrate. Since both of these connection methods utilize a substrate, and since additional sealing material is required in accordance with the height of the wire loop, the package becomes thick. Moreover, the package becomes expensive due to the cost of the substrate. The package becomes particularly expensive when a flip chip connection is used since an expensive buildup substrate is required.

When connection is performed by means of wire bonding, the inductance of the wire part increases.

An object of this invention is therefore to provide a semiconductor device having a constitution in which design freedom in the disposal pitch and disposal positions of external terminals is increased and the package itself can be made compact.

SUMMARY OF THE INVENTION

In order to achieve this object, a semiconductor device of this invention has a constitution such as the following. That is, the semiconductor device of this invention comprises a base frame having a first surface, and a second surface which opposes the first surface, and having an opening portion formed through the base frame.

The semiconductor device of this invention also comprises a semiconductor chip which has a first main surface on which a plurality of electrode pads are provided and a second main surface opposing the first main surface. The semiconductor chip is disposed within the opening portion such that the level (i.e. height, same hereinafter) of the first main surface is substantially equal to the level of the first surface.

Further, an insulating film is formed on the first surface and first main surface such that a part of each of the plurality of electrode pads is exposed.

A plurality of wiring patterns are electrically connected to the plurality of electrode pads, respectively and extended from the electrode pads to the upper side of the first surface of the base frame, respectively.

A sealing portion is formed on the wiring patterns and insulating film such that a part of the wiring patterns is exposed.

The semiconductor device of this invention further comprises a plurality of external terminals provided on the wiring patterns in a region including the upper side of the base frame.

According to the constitution of the semiconductor device of this invention, external electrodes may also be provided in a region including the upper side of (directly above) the base frame which is provided so as to surround the semiconductor chip, and thus a semiconductor device having increased design freedom in the disposal pitch, disposal positions, and so on of the external electrodes can be provided.

Further, the semiconductor device of this invention may be constructed without the use of an interposer such as a substrate by applying a so-called WCSP manufacturing process, as a result of which increases in operating speed, functional sophistication, number of functions, and compactness can be achieved in comparison with a wire bonding connection.

Moreover, an identical electrical characteristic can be obtained at a lower cost than a device in which a flip chip connection is used.

The manufacturing process for implementing this invention preferably comprises the following manufacturing steps.

A manufacturing method of the semiconductor device comprises:

(1) providing abase frame having a plurality of opening portions on a lower base such that a semiconductor chip disposal region on the lower base is exposed;

(2) preparing a semiconductor chip having a first main surface on which a plurality of electrode pads are provided and a second main surface which opposes the first main surface;

(3) disposing the semiconductor chip in the opening portion such that the level of the first main surface is substantially equal to the level of a first surface of the base frame and such that the second main surface faces the semiconductor chip disposal region;

(4) forming an insulating film on the first surface of the base frame and the first main surface such that a part of each of the electrode pads is exposed;

(5) forming a plurality of wiring patterns on the insulating film so as to be electrically connected to the electrode pads, respectively and extended from the electrode pads to the upper side of the first surface of the base frame, respectively;

(6) forming a sealing portion on the wiring patterns and insulating film such that a part of each of the wiring patterns positioned on the first surface is exposed;

(7) forming a plurality of external terminals on the wiring patterns in a region including the upper side of the base frame and connecting the external terminals to the wiring patterns; and (8) forming individual semiconductor devices comprising the semiconductor chip by cutting the base frame between the plurality of semiconductor chips.

The manufacturing method of the semiconductor device also comprises:

(1) providing abase frame having a plurality of opening portions on a lower base such that a semiconductor chip disposal region on the lower base is exposed;

(2) preparing a semiconductor chip having a first main surface on which a plurality of electrode pads is provided and a second main surface which opposes the first main surface;

(3) disposing the semiconductor chip in the opening portion such that the level of the first main surface is substantially equal to the level of a first surface of the base frame and such that the second main surface faces the semiconductor chip disposal region;

(4) forming an insulating film on the first surface of the base frame and the first main surface such that a part of the electrode pads is exposed;

(5) forming a plurality of wiring patterns on the insulating film so as to be electrically connected to the electrode pads, respectively and extended from the electrode pads to the upper side of the first surface of the base frame, respectively;

(6) forming a plurality of electrode posts on a part of each of the wiring patterns positioned on the upper side of the base frame;

(7) forming a sealing portion through which the top surface of the electrode posts is exposed on the wiring patterns and insulating film;

(8) forming external terminals on the top surface of the exposed electrode posts; and (9) forming individual semiconductor devices comprising the semiconductor chip by cutting the base frame between the plurality of semiconductor chips.

Here, a further step of removing the lower base from the second surface of the extension portion and the second main surface may be added following the step of forming the external terminals.

The manufacturing method of the semiconductor device further comprises:

(1) preparing a jig comprising a plurality of convex portions and concave portions positioned between these convex portions;

(2) preparing a base frame in which a plurality of opening portions is formed and which comprises a first surface, a second surface opposing the first surface, and the plurality of opening portions which pass through the first surface to the second surface;

(3) preparing a semiconductor chip having a first main surface on which a plurality of electrode pads is provided and a second main surface which opposes the first main surface;

(4) placing the base frame on the jig such that the second surface faces the concave portion and the convex portion is positioned within the opening portion;

(5) disposing the semiconductor chip on the convex portion within the opening portion such that the level of the first main surface is substantially equal to the level of the first surface of the base frame and such that the second main surface faces the surface of the convex portion;

(6) forming an insulating film on the first surface and first main surface such that a part of each of the electrode pads is exposed;

(7) forming a plurality of wiring patterns on the insulating film so as to be electrically connected to the electrode pads, respectively and extended from the electrode pads to the upper side of the first surface of the base frame, respectively;

(8) forming a sealing portion on the wiring patterns and insulating film such that a part of the wiring patterns positioned on the first surface is exposed;

(9) forming a plurality of external terminals on the wiring patterns in a region including the upper side of the base frame and connecting the external terminals to the wiring patterns; and

(10) forming individual semiconductor devices comprising the semiconductor chip by cutting the base frame between the plurality of semiconductor chips.

The manufacturing method of the semiconductor device further comprises:

(1) preparing a jig comprising a plurality of convex portions and concave portions positioned between these convex portions;

(2) preparing a base frame in which a plurality of opening portions are formed and which comprises a first surface, a second surface opposing the first surface, and the plurality of opening portions which pass through the first surface to the second surface;

(3) preparing a semiconductor chip having a first main surface on which a plurality of electrode pads are provided and a second main surface which opposes the first main surface;

(4) placing the base frame on the jig such that the second surface faces the surface of the concave portion and the convex portion is positioned within the opening portion;

(5) disposing the semiconductor chip on the convex portion within the opening portion such that the level of the first main surface is substantially equal to the level of the first surface of the base frame and such that the second main surface faces the surface of the convex portion;

(6) forming an insulating film on the first surface and first main surface such that a part of each of the electrode pads is exposed;

(7) forming a plurality of wiring patterns on the insulating film so as to be electrically connected to the electrode pads, respectively and extended from the electrode pads to the upper side of the first surface of the base frame, respectively;

(8) forming a plurality of electrode posts on a part of each of the wiring patterns positioned on the upper side of the base frame;

(9) forming a sealing portion through which the top surface of the electrode posts is exposed on the wiring patterns and insulating film;

(10) forming external terminals on the top surface of the exposed electrode posts; and

(11) forming individual semiconductor devices comprising the semiconductor chip by cutting the base frame between the plurality of semiconductor chips.

The manufacturing method of the semiconductor device further comprises:

(1) preparing a jig having a plurality of convex portions and concave portions positioned between these convex portions;

(2) preparing a base frame having a first surface, a second surface which opposes the first surface, a plurality of opening portions which pass through the first surface to the second surface, a plurality of through holes which pass through the first surface to the second surface, and an inter-layer wiring which is formed within the through hole;

(3) preparing a first semiconductor chip having a first main surface on which a plurality of electrode pads are provided and a second main surface which opposes the first main surface, and a second semiconductor chip having a third main surface on which a plurality of electrode pads are provided and a fourth main surface which opposes the third main surface;

(4) placing the base frame on the jig such that the second surface faces the surface of the concave portion and the convex portion is positioned within the opening portion;

(5) disposing the first semiconductor chip on the convex portion within the opening portion such that the level of the first main surface is substantially equal to the level of the first surface of the base frame and the second main surface faces the surface of the convex portion;

(6) forming a first insulating film on the first surface and first main surface such that a part of each of the first electrode pads and one end of the inter-layer wiring are exposed;

(7) forming a plurality of first wiring patterns on the first insulating film so as to be connected to the first electrode pads, respectively and one end of the inter-layer wiring and extended from the first electrode pads to the upper side of the first surface of the base frame, respectively;

(8) forming a first sealing portion on the first wiring patterns and first insulating film such that a part of each of the first wiring patterns positioned on the first surface is exposed;

(9) removing the base frame having the first semiconductor chip from the jig and turning the base frame over;

(10) disposing the second semiconductor chip within the opening portion such that the level of the third main surface is substantially equal to the level of the second surface and such that the fourth main surface faces the surface of the convex portion;

(11) forming a second insulating film on the second surface and third main surface such that a part of each of the second electrode pads and the other end of the inter-layer wiring are exposed;

(12) forming a plurality of second wiring patterns on the second insulating film so as to be connected to the second electrode pads, respectively and the other end of the inter-layer wiring and extended from the second electrode pads to the upper side of the second surface of the base frame;

(13) forming a second sealing portion on the second wiring patterns and second insulating film such that a part of each of the second wiring patterns positioned on the second surface is exposed;

(14) forming first and second external terminals on the top surfaces of the exposed first and second wiring patterns respectively; and

(15) forming individual semiconductor devices comprising a stacked body of the first and second semiconductor chips by cutting the base frame between the plurality of opening portions.

The manufacturing method of the semiconductor device further comprises:

(1) preparing a jig having a plurality of convex portions and concave portions positioned between these convex portions;

(2) preparing a base frame having a first surface, a second surface which opposes the first surface, a plurality of opening portions which pass through the first surface to the second surface, a plurality of through holes which pass through the first surface to the second surface, and an inter-layer wiring which is formed within the through hole;

(3) preparing a first semiconductor chip having a first main surface on which a plurality of electrode pads are provided and a second main surface which opposes the first main surface, and a second semiconductor chip having a third main surface on which a plurality of electrode pads are provided and a fourth main surface which opposes the third main surface;

(4) placing the base frame on the jig such that the second surface faces the surface of the concave portion and the convex portion is positioned within the opening portion;

(5) disposing the first semiconductor chip on the convex portion within the opening portion such that the level of the first main surface is substantially equal to the level of the first surface of the base frame and the second main surface faces the surface of the convex portion;

(6) forming a first insulating film on the first surface and first main surface such that a part of each of the first electrode pads and one end of the inter-layer wiring are exposed;

(7) forming a plurality of first wiring patterns on the first insulating film so as to be connected to the first electrode pads and one end of the inter-layer wiring, respectively and extended from the first electrode pads to the upper side of the first surface of the base frame, respectively;

(8) forming a plurality of first electrode posts on a part of each of the wiring patterns positioned on the upper side of the base frame;

(9) forming a first sealing portion through which the top surface of the first electrode posts is exposed on the first wiring patterns and first insulating film;

(10) removing the base frame comprising the first semiconductor chip from the jig and turning the base frame over;

(11) disposing the second semiconductor chip within the opening portion such that the level of the third main surface is substantially equal to the level of the second surface and such that the fourth main surface faces the surface of the convex portion;

(12) forming a second insulating film on the second surface and third main surface such that a part of the second electrode pads and the other end of the inter-layer wire connection are exposed;

(13) forming a plurality of second wiring patterns on the second insulating film so as to be connected to the second electrode pads, respectively and the other end of the inter-layer wiring and extended from the second electrode pads to the upper side of the second surface of the base frame, respectively;

(14) forming a plurality of second electrode posts on a part of each of the second wiring patterns positioned on the upper side of the base frame;

(15) forming a second sealing portion through which the top surface of the second electrode posts is exposed on the second wiring patterns and second insulating film;

(16) forming first and second external terminals on the top surfaces of the exposed first and second electrode posts respectively; and

(17) forming individual semiconductor devices having a stacked body of the first and second semiconductor chips by cutting the base frame between the plurality of opening portions.

In the manufacturing process described above, the base frame is preferably suction-held on the surface of the concave portion by a first suction and exhaust system provided on the concave portion, and the first semiconductor chip is preferably suction-held on the surface of the convex portion by a second suction and exhaust system provided on the convex portion.

According to this manufacturing method for the semiconductor device of this invention, a semiconductor device with increased functional sophistication, number of functions, and compactness can be provided by means of a comparatively easy process. In particular, design freedom in the disposal pitch, disposal positions, and so on of the external electrodes can be greatly increased.

BRIEF DESCRIPTION OF THE DRAWINGS

The foregoings and other objects, features and advantageous of the present invention will be better understood from the following description taken in connection with the accompanying drawings, in which:

FIG. 1(B) is a plan view showing an expanded outline of the main parts of one region of (A) in order to illustrate the connection relationship between a wiring pattern and electrode pads, while

DESCRIPTION OF THE PREFERRED EMBODIMENTS

Figure 1A:
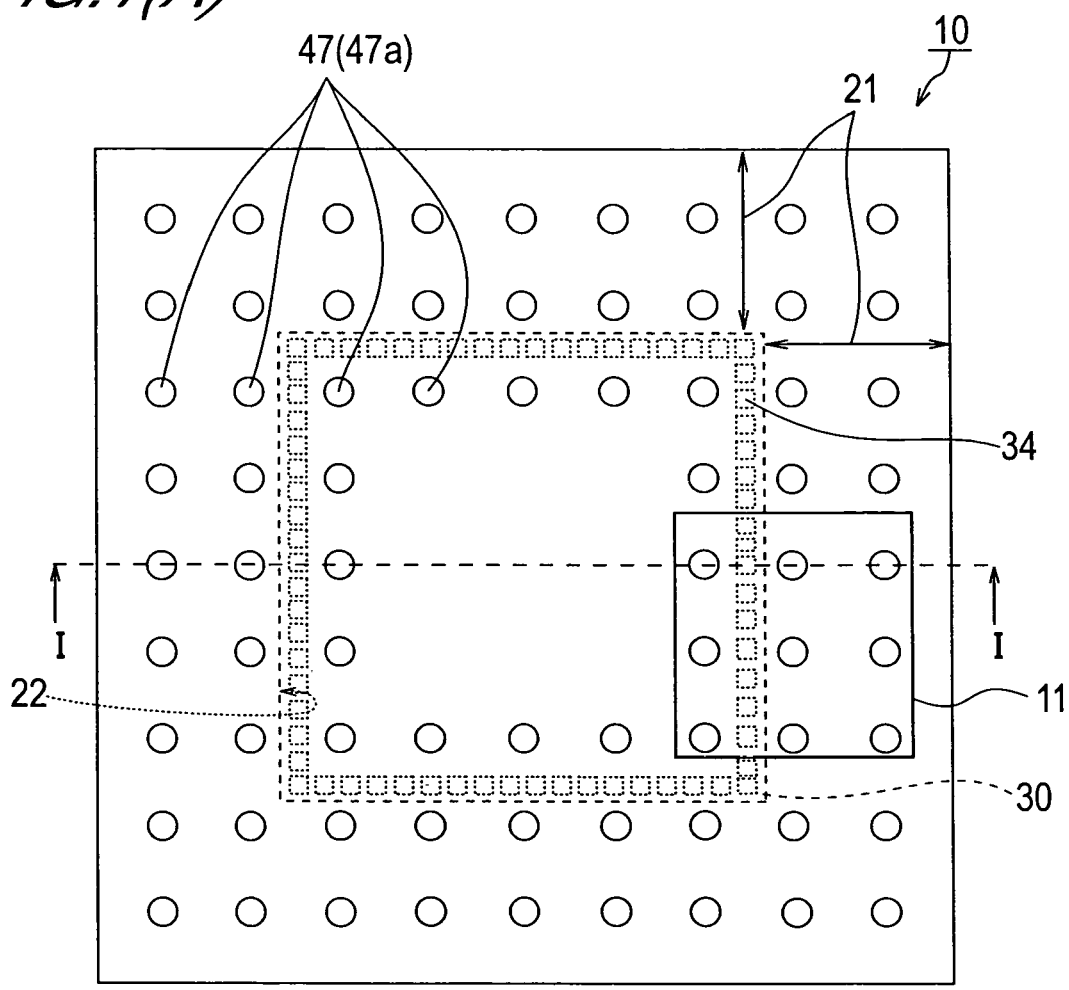
FIG. 1(A) is a plan view seen from above showing in outline the constitution of a semiconductor device of a first embodiment.

Embodiments of this invention will be described below with reference to the drawings. Note that in the drawings, the form, magnitude, and positional relationships of each constitutional component are merely illustrated schematically in order to facilitate understanding of this invention and no particular limitations are placed on this invention thereby. Further, although specific materials, conditions, numerical value conditions, and so on are used in the following description, these are merely one preferred example thereof and therefore do not place any limitations on this invention. It is to be understood that similar constitutional components in the drawings used in the following description are allocated and illustrated with identical reference symbols, and that duplicate description thereof has occasionally been omitted.

First Embodiment

Figure 1B:
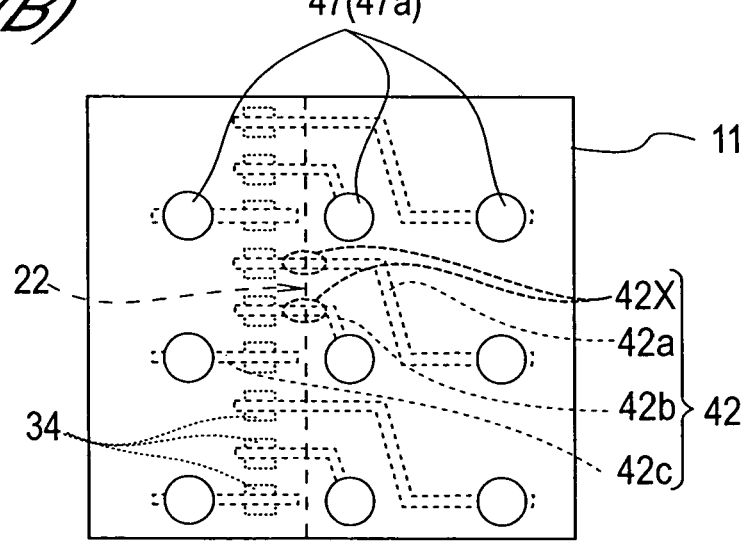
Figure 1C:
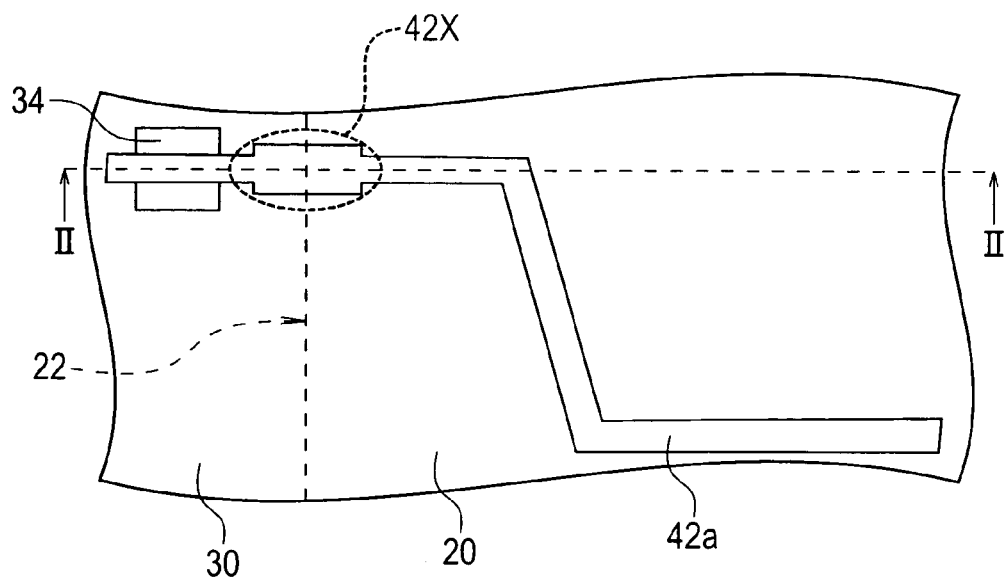
FIG. 1(C) is a detailed view according to FIG. 1(A) and FIG. 1(D) is a cross sectional view taken on line II—II of FIG. 1(C)
Figure 1D:
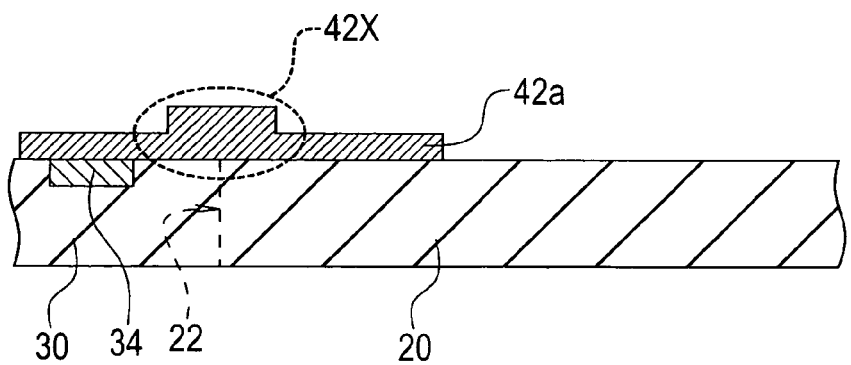
Figure 2A:
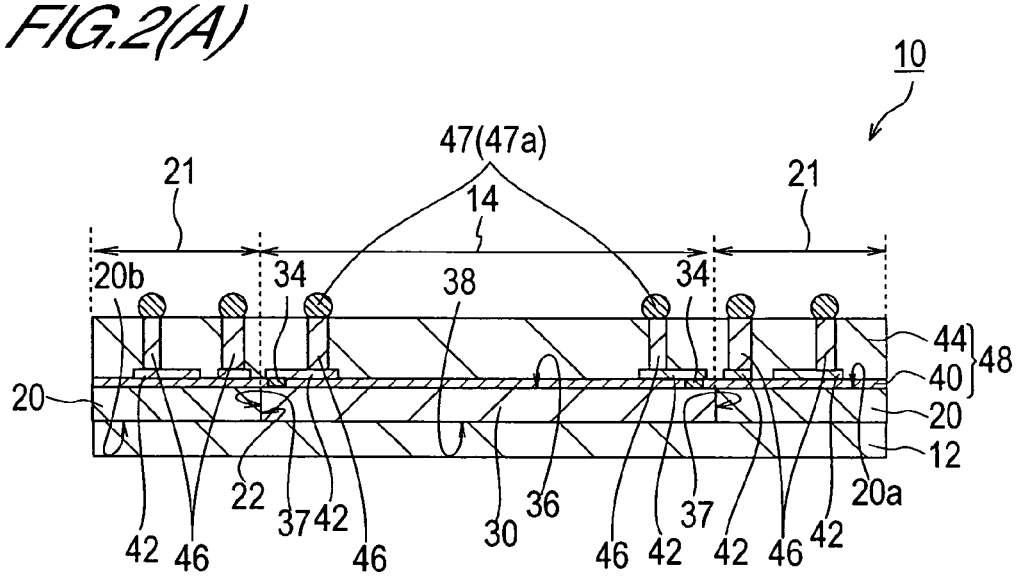
FIGS. 2(A) and 2(B) are schematic sectional views showing cross sections severed along a broken line I—I in FIG. 1(A)
Figure 2B:
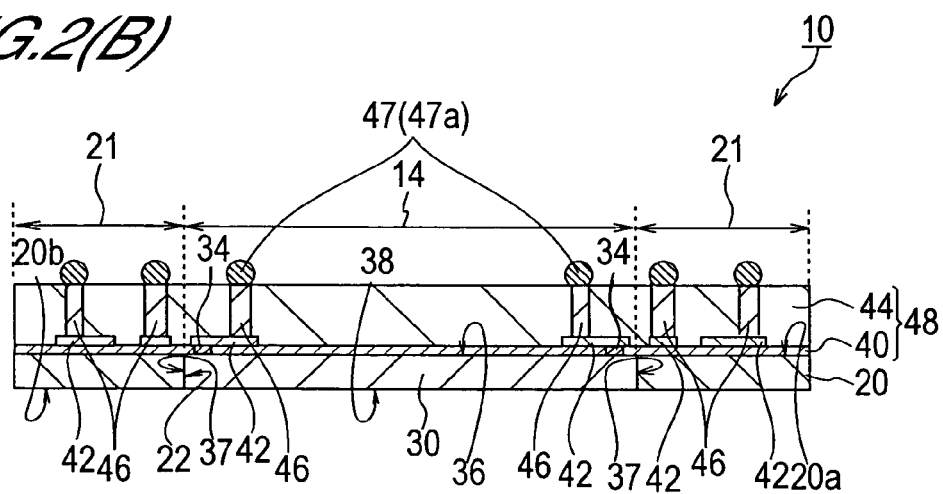

A semiconductor device according to a first embodiment of this invention will be described with reference to FIGS. 1 and 2. FIG. 1(A) is a plan view seen from above showing in outline the constitution of the semiconductor device of the first embodiment, and FIG. 1(B) is a plan view showing an expanded outline of the main parts of the region of FIG. 1(A) which is surrounded by a solid line 11 in order to illustrate the connection relationship between a wiring pattern and electrode posts. FIGS. 2(A) and 2(B) are schematic sectional views showing cross sections severed along a broken line I—I in FIG. 1(A). Note that FIG. 2(A) shows a constitutional example in which the semiconductor device 10 of this invention is provided with a lower base 12 on its bottom surface. FIG. 2(B) shows a constitutional example in which the lower base 12 is not provided.

The semiconductor device 10 of the first embodiment of this invention comprises on the lower base 12 a base frame 20 having an opening portion 22 which is a through hole (see FIG. 2(A)). This base frame 20 is, for example, a square frame-shaped portion which preferably comprises a first surface 20a serving as the surface thereof and a second surface 20b serving as the rear surface thereof. The square opening portion 22 which passes through the first surface 20a to the second surface 20b is formed in the center thereof.

The base frame 20 may be formed from a plate-form body or a sheet-form body made of an organic material such as a glass epoxy or a polyimide. The base frame 20 may also be formed from a substrate appropriately selected from a substrate group comprising a ceramic substrate, a metallic substrate, and an Si substrate. A Si substrate is preferably used as the base frame 20. In so doing, the heat resistant stress characteristic of subsequently formed wiring patterns can be improved.

The above-mentioned opening portion 22 may be appropriately formed in accordance with the material constituting the base frame 20 using a well-known method such as laser processing, a mechanical process such as punching, or metalworking. The magnitude of the opening portion 22 is set to be substantially identical to or slightly larger than the magnitude of a semiconductor chip 30 so that the semiconductor chip 30 can be provided inside the opening portion 22. A plurality of opening portions 22 is disposed in a lattice formation in the base frame 20, preferably at equal intervals from each other. These intervals are determined in consideration of the desired number of external terminals, the spacing between the external terminals, the surface area of an extension portion 21, and so on.

The semiconductor chip 30 is disposed inside the opening portion 22 by being fitted therein or the like. Thus side surfaces 37 of the semiconductor chip 30 are surrounded by the base frame 20 and the surface region of the base frame 20 is formed adjacent to and apart from the surface region of the semiconductor chip 30. The semiconductor chip 30 comprises a first main surface 36, a second main surface 38 which opposes the first main surface 36, and one or two or more side surfaces 37 which exist between the first main surface 36 and second main surface 38. The level of the first main surface 36 is set to be substantially equal to the level of the first surface 20a. The first main surface 36 comprises electrode pads 34. The electrode pads 34 are formed in a plurality around the peripheral edge of the first main surface 36.

The semiconductor chip 30 is provided inside the opening portion 22 such that the first main surface 36 becomes the upper surface, or in other words such that the second main surface 38 faces a semiconductor chip disposal region 14 of the lower base 12.

An insulating film 40 is formed on the first surface 20a of the base frame 20 and the first main surface 36 such that a part of each of the plurality of electrode pads 34 is exposed.

A plurality of wiring patterns 42 are formed on the surface of the insulating film 40 and electrically connected to the exposed electrode pads 34.

A sealing portion 44 is provided on the respective surface regions of the semiconductor chip 30 and base frame 20 so as to cover the wiring patterns 42 and insulating film 40. The insulating film 40 and sealing portion 44 may also be referred to collectively as an insulation layer 48. Electrode posts 46 are provided on each wiring pattern 42 so as to pass through the sealing portion 44 and reach the surface of the sealing portion 44. Some of the electrode posts 46 are provided on the upper side of (directly above) the semiconductor chip 30, and the remaining electrode posts 46 are provided on the upper side of (directly above) the base frame 20. These electrode posts 46 are normally arranged at constant intervals. Further, the top surface of each electrode post 46 is exposed on the surface of the sealing portion 44. The electrode posts 46 are also known as post electrodes, and external terminals 47 are provided on the exposed top surfaces thereof. Solder balls 47a are normally used as the external terminals 47. The external terminals 47 are arranged at a first pitch wider than a second pitch at which the electrode pads 34 is arranged.

Here, using FIG. 1(B), the connection relationships between the electrode pads 34 and wiring patterns 42 will be described. A partial region (the region surrounded by the solid line) 11 of FIG. 1(A) has been expanded and illustrated in order to facilitate understanding of these connection relationships. The wiring patterns 42 are constituted such that each of the electrode posts (shown as 46 in FIG. 2) connected to the lower portion of the external terminals 47 is regularly and electrically connected to a corresponding electrode pad 34. A long wire 42a, a medium wire 42b, and a short wire 42c, for example, are provided as the wires which constitute each wiring pattern 42. These wires 42a, 42b, and 42c are respectively connected in that order to the corresponding electrode pad 34 in a one-on-one connection relationship of one wire to one electrode pad.

The wiring patterns 42 include wiring patterns that provided on the upper side of (directly above) the semiconductor chip 30 and on the upper side of (directly above) the base frame 20, or in other words so as to straddle the boundary (22) of the extension portion 21 region.

Hence the portions 42X of the wiring patterns 42 having a certain length on or in the vicinity of this boundary is preferably comprised of thicker and/or wider wire. In other word, The portions 42X of the wiring patterns 42 on a boundary and vicinity thereof between a region on the upper side of said semiconductor chip 30 and the base flame 20 are formed wider or more thickly than other portions of said wiring patterns 42. As an example, a rectangular thicker and wider wiring portion 42X is illustrated in detailed FIGS. 1(C) and 1(D). The other features illustrated in FIGS. 1(C) and 1(D) are labeled by the same reference numerals as in the other figures.

By forming the portions 42X of the patterns 42 at which stress is considered more likely, due to such phenomena as thermal stress and particularly an edge effect, to be thicker and/or wider in this manner, operational reliability in the semiconductor device 10 is improved.

The region on the upper side of (directly above) the base frame 20 is referred to as the extension portion 21 due to the fact that the external terminal forming region extends beyond the surface region of the semiconductor chip 30. In this constitutional example, electrode posts 46 are also formed on the extension portion 21.

The sealing portion 44 is formed so as to cover the wiring patterns 42 and electrode posts 46. The sealing portion 44 is formed such that a part of the electrode posts 46 is exposed.

The external terminals 47 are formed via the electrode posts 46. A constitution is also possible in which the external terminals are directly connected to the wiring patterns 42 without passing through the electrode posts by exposing a part of the wiring patterns 42 through the sealing portion 44.

In this constitutional example, the external terminals 47 are formed from solder balls 47a, for example. These solder balls 47a are provided in contact with the top surface of the electrode posts 46 and connected to the wiring patterns 42 via the electrode posts 46. The arrangement and spacing of adjacent electrode posts 46 may be set as desired in consideration of mounting onto a printed board or the like, for example.

As described above, the electrode posts 46 are provided not only within a surface area range corresponding to the upper side of the semiconductor chip 30, but also on the upper side of the base frame 20, or in other words on the extension portion 21. As a result, design freedom in the disposal positions and disposal pitch of the electrode posts 46 is increased. In other words, restrictions on the disposal pitch of the electrode posts 46, that is the external terminals 47, are eased such that mounting is facilitated, and thus the electrode posts 46 can be formed at wider intervals in accordance with the constitutional requirements on the mounting substrate side, for example. More specifically, external electrodes can be formed at an appropriate disposal pitch and in a desired number by appropriately adjusting the surface area of the base frame 20.

According to the constitution of the semiconductor device 10 of this invention, the external terminals 47 are provided in the region of the extension portion 21 apart from the region directly above the semiconductor chip 30, and thus the semiconductor device 10 may be constructed with a so-called fan-out configuration or a fan-in/fan-out configuration in which the external terminals 47 are also formed in the region on the first main surface 36. Hence design freedom in the disposal pitch, disposal positions, and so on of the external terminals 47 can be increased.

Further, the semiconductor device 10 of this invention is constituted using a so-called WCSP manufacturing process such that the semiconductor chip 30 and external electrodes 47 are directly connected without the use of an interposer such as a substrate, and thus in addition to the aforementioned effect, the operational speed, functional sophistication, number of functions, and compactness of the semiconductor device 10 can be increased in comparison with a device in which a wire bonding connection, for example, is used. The semiconductor device 10 can also be obtained with an identical electrical characteristic to and at a lower cost than a device in which a flip chip connection, for example, is used.

Modified Example of the First Embodiment

Next, a modified example of the semiconductor device of the first embodiment will be described with reference to FIG. 3. Note that the plan view seen from above of this example is substantially identical to FIG. 1(A), and hence diagrammatic representation and detailed description thereof have been omitted.

Figure 3A:
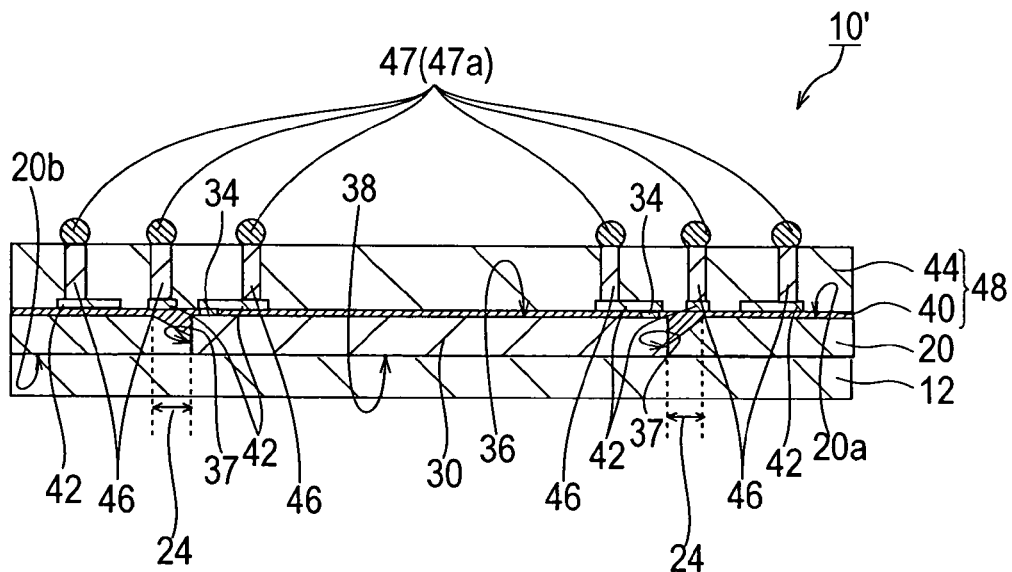
FIGS. 3(A) and 3(B) are schematic sectional views of a modified example of the first embodiment showing cross sections severed along the I—I broken line in FIG. 1(A)
Figure 3B:
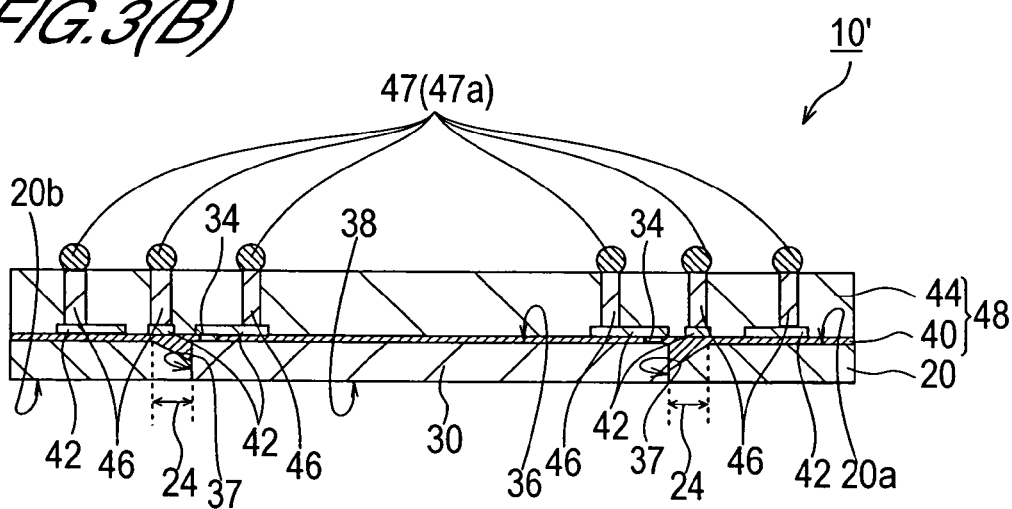

FIGS. 3(A) and 3(B) are schematic sectional views of a semiconductor device 10' of the modified example and correspond to FIGS. 2(A) and 2(B) respectively. FIG. 3(A) shows a constitutional example in which the semiconductor device 10' is provided with the lower base 12 on its bottom surface. FIG. 3(B) shows a constitutional example in which the lower base 12 is not provided.

The semiconductor 10' of this modified example differs in the form of peripheral inside walls 24 which define the opening portion 22 of the base frame 20. Accordingly, other similar constitutional components to the first embodiment are allocated and illustrated with identical reference symbols and duplicate description thereof has been omitted.

In the semiconductor device 10' of this modified example, the inside walls 24 which define the opening portion 22 of the base frame 20, of which there are four in this example, are each provided in an inclined form such that each of the four inside walls 24 decreases in thickness from the base frame 20 side toward the opening portion 22 side, or in other words toward the semiconductor chip 30. That is, the inside walls 24 have a so-called wedge-form.

By constituting the inside walls 24 in such a manner, an identical working effect to that of the semiconductor device described in the first embodiment can be obtained, and moreover, as will be understood from the following description, a particularly favorable effect can be obtained in the manufacturing process of this semiconductor device 10'.

A stacked semiconductor device can be formed by stacking a plurality of the semiconductor devices 10 and/or 10' of the first embodiment and/or modified example described above. In this case, a terminal for-connecting stacked individual semiconductor devices to each other may be formed by forming a through hole in the base frame using a well-known method, for example, such that an inter-layer wire connection is formed.

First Manufacturing Method of the First Embodiment

Next, a first manufacturing method for the semiconductor device of the first embodiment will be described with reference to FIGS. 4(A) to 10(B).

As a rule, each Fig. (A) is a partial schematic plan view for illustrating the constitution of the semiconductor device of this invention, and each Fig. (B) is a schematic sectional view showing a cross section severed along a broken line I—I of the corresponding Fig. (A). Note that FIGS. 6(B) and 7 are exceptions to the rule, showing an expanded view of the part surrounded by a solid line 11 in FIG. 6(A) and a sectional view severed along the I—I line in FIG. 6(A) respectively.

First, semiconductor chip disposal regions 14 on which a plurality of semiconductor chips 30 is to be placed are set on a prepared lower base 12. Naturally, the profile of the semiconductor chip disposal region 14 substantially matches the profile of the opening portion 22 provided in the base frame 20. The intervals between adjacent semiconductor chip disposal regions 14, and thus the intervals between adjacent opening portions 22, are set to be equal. This interval is preferably set to a sufficient value in consideration of the surface area of the lower base margin required when the semiconductor devices are divided into individual units, or in other words, when singularization processing is implemented, in a subsequent process, of the surface area of the surface region of the extension portion which is formed in accordance with the desired number of external terminals, and so on.

Figure 4A:
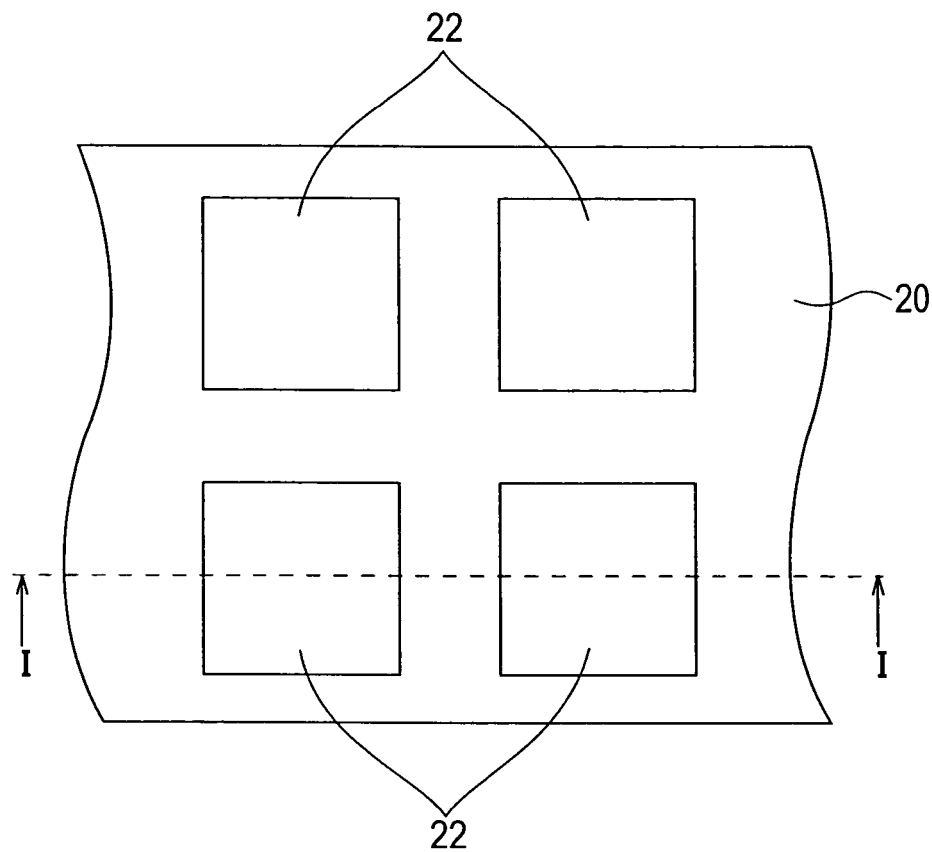
FIGS. 4(A) and 4(B) are a plan view seen from above and a sectional view (1) for illustrating a first manufacturing method for the semiconductor device according to the first embodiment of this invention.
Figure 4B:
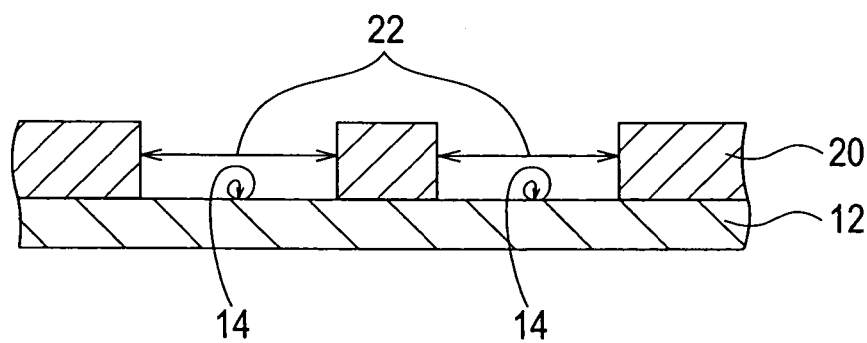

First, as shown in FIGS. 4(A) and 4(B), the set semiconductor chip disposal regions 14 and opening portions 22 are positionally aligned, and the base frame 20 is placed on the lower base 12.

Here, the lower base 12 may be formed from a plate-form or sheet-form body made of an organic material such as a glass epoxy or a polyimide, for example. Alternatively, the lower base 12 may be formed from a substrate appropriately selected from a ceramic substrate, a metallic substrate, a Si substrate, or similar. The surface of the lower base 12 preferably comprises adhesion means (not shown in the drawings) in at least the region on which the base frame 20 is placed which are easily peeled away by heating, ultraviolet radiation, or another type of processing, for example.

Particularly if the semiconductor device of this invention is to be formed without a lower base, a lower base which can be removed in a subsequent step using a method such as peeling away from the base frame should be selected. Specifically, a thermal release sheet "Revalpha" (product name), manufactured by Nitto Denko Corporation, heat-resistant "Icros Tape" (product name) or the "SP Series" (product name), manufactured by Mitsui Chemicals Inc., or similar may be used as a peelable lower base. A glass substrate or the like on whose surface an ultraviolet curable adhesive, for example, is painted to serve as adhesion means may also be favorably applied as a lower base.

The base frame 20 which is placed on the lower base 12 is adhered to and held by the adhesion means provided on the surface of the lower base 12.

Thus the semiconductor chip disposal regions 14 which are set in advance on the lower base 12 are exposed from the opening portions 22 formed in the base frame 20.

Figure 5A:
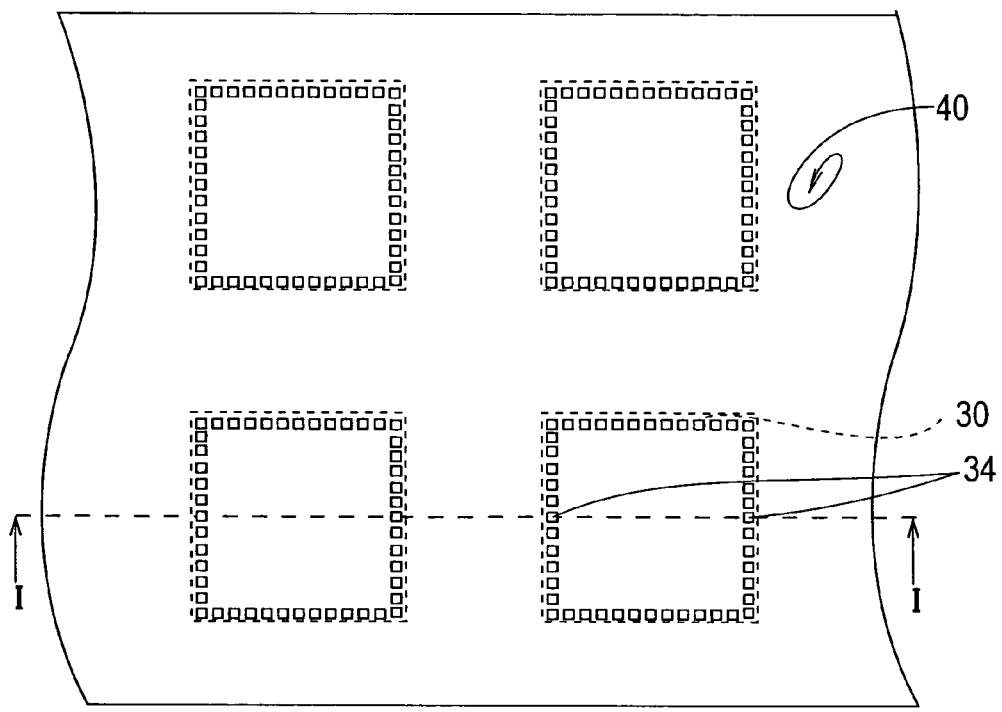
FIGS. 5(A) and 5(B) are a plan view seen from above and a sectional view (2) for illustrating the first manufacturing method of the semiconductor device according to the first embodiment of this invention.
Figure 5B:
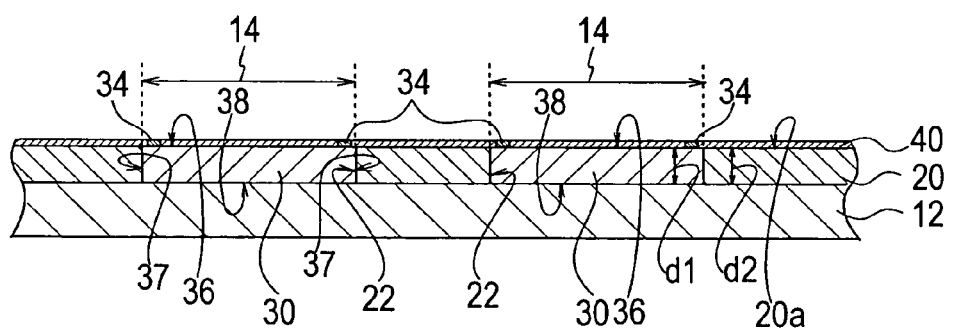

Next, as shown in FIGS. 5(A) and 5(B), semiconductor chips 30 are disposed on the semiconductor chip disposal regions 14 exposed within the opening portions 22.

Adhesion means are preferably provided on the semiconductor chip disposal regions 14. The semiconductor chips 30 may then be adhered to and held on the semiconductor chip disposal regions 14 by these adhesion means.

Here, the height of the first surface 20a of the base frame 20, that is a thickness d2, and the height of the surface of the semiconductor chip 30 provided inside the opening portion 22, that is a thickness d1, preferably match. However, a slight height difference may exist between the two surfaces as long as this difference is within the range of a difference of elevation at which the wiring patterns may be formed on the upper surfaces of the first surface 20a of the base frame 20 and the first main surface 36 of the semiconductor chip 30 without the danger of the wires becoming disconnected or the like.

When the cross sections of the inside walls 24 of the opening portions 22 in the base frame 20 have an inclined so-called wedge-form as described above using FIG. 3, the incline of the surface of the inside walls 24 allows the semiconductor chip 30 to be disposed in a desired position inside the opening portion 22 more easily and smoothly by sliding the surface thereof along the incline of the inside walls 24.

The semiconductor chip 30 is provided with a second main surface 38 which faces the first main surface 36. A circuit element (not shown) having a predetermined function is formed on the semiconductor chip 30. Electrode pads 34 which are electrically connected to the circuit element are provided on the first main surface 36. The electrode pads 34 are provided in an array around the peripheral edge of the first main surface 36.

The semiconductor chip 30 described above is, for example, fitted into the opening portion 22 such that the second main surface 38 thereof faces the lower base 12 in the semiconductor chip disposal region 14. If adhesion means are provided on the surface of the semiconductor chip disposal region 14 at this time, then the second main surface 38 is adhered thereto and held thereby.

Next, the insulating film 40 is formed on the first surface 20a of the base frame 20 and the first main surface 36. The insulating film 40 is formed such that at least a part of each of the electrode pads 34 on the semiconductor chip 30 is exposed. Here, the insulating film 40 is formed so as to cover the electrode pads 34, whereupon the top surface of the electrode pads 34 may be exposed using a photolithography method or the like.

As noted above, a height difference may exist between the surface of the base frame 20 and the first main surface 36 of the semiconductor chip 30, or the surface of the inside walls 24 of the base frame 20 may be inclined as described above. In such cases, the height difference may be reduced to a degree which allows the formation of wiring patterns in a subsequent step using the insulating material of the insulating film 40, or the surface of the insulating film 40 may be formed substantially flat.

Formation of the insulating film 40 may be performed using an appropriate insulating material and by means of a method which is suited to the material of the base frame 20, for example a well-known method such as spin coating, printing, or direct application.

If, at this time, a gap appears between the base frame 20 and semiconductor chip 30, insulating material is inserted into the gap to fix together and integrate the base frame 20 and semiconductor chip 30.

Then, as shown in FIGS. 6 and 7, a plurality of wiring patterns 42 are formed on the surface of the insulating film 40. Formation of these wiring patterns 42 is performed following setting such that each wiring pattern 42 is electrically connected to a corresponding electrode pad 34 on the surface of the insulating film 40 and in consideration of the disposal of external terminals to be formed at a later stage.

More specifically, the wire width, wire spacing, optimum angles, and so on are determined in accordance with applicable wiring process rules such that connections can be made at the shortest possible distances. As shown in the drawings, for example, a plurality of wiring pattern groups, each comprising a long wire 42a, a medium wire 42b, and a short wire 42c, is formed in respect of the plurality of electrode pads 34 formed around the peripheral edge of the semiconductor chip 30 at the shortest possible distances, and one end portion of each wire is connected to the corresponding electrode pad 34. An electrode post mounting pad is formed on the other end portion so that an external terminal 47 (solder ball 47a) can be connected thereto via an electrode post.

Figure 6A:
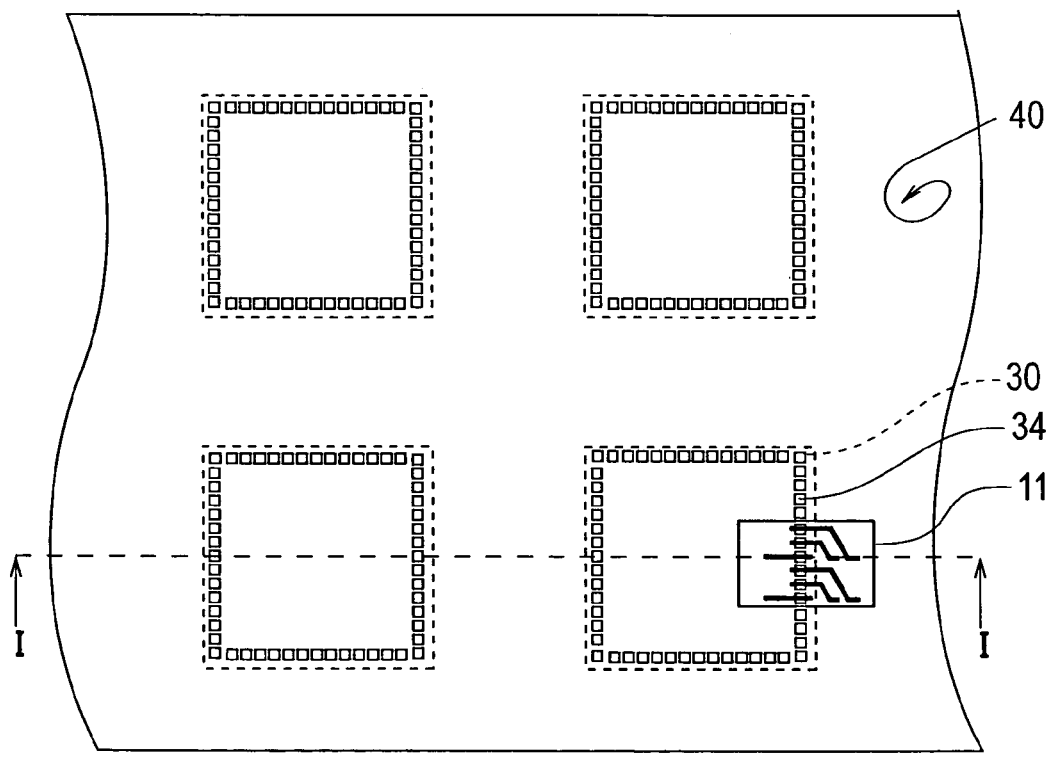
FIGS. 6(A) and 6(B) are a plan view seen from above and a sectional view (3) for illustrating the first manufacturing method of the semiconductor device according to the first embodiment of this invention.
Figure 6B:
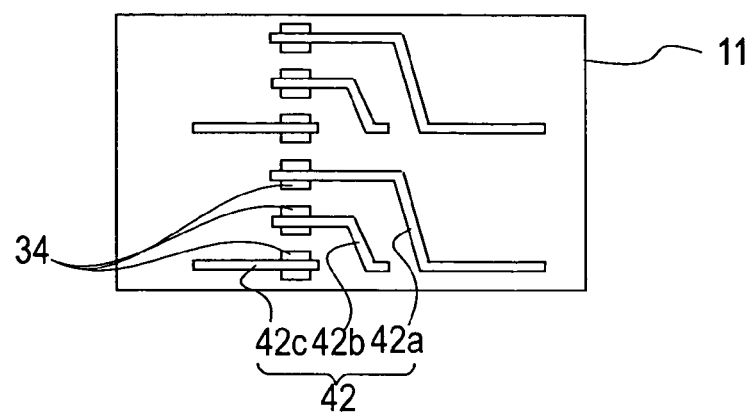
Figure 7:
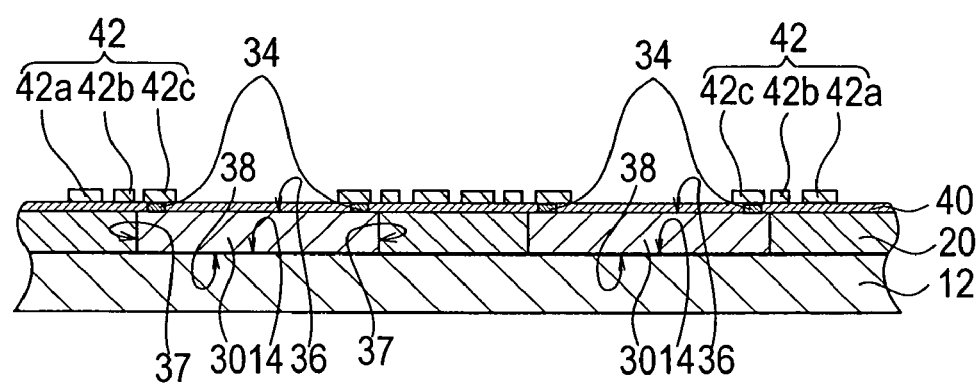
FIG. 7 is a sectional view corresponding to FIG. 6(A)

Note that in the constitutional example shown in FIGS. 5(A) and 6(A), the number of illustrated disposed electrode pads 34 is smaller than the actual number.

The wiring patterns 42 may be formed by performing a wiring pattern formation process such as sputtering and photolithography in a well-known WCSP manufacturing process on a region corresponding to the upper side of (directly above) the base frame 20 on the surface region of the insulating film 40, or in other words a desired region on the insulating film 40 which includes the extension portion 21.

As for the material for forming the wiring pattern 42, a favorable material may be selected at will, but the wiring pattern 42 is preferably formed from a material such as aluminum, copper, or a metal alloy.

If it is assumed that in the wiring pattern 42 forming step, stress becomes concentrated due to a height difference as described above, the region of the wiring patterns 42 which substantially includes the part of the wiring pattern 42 at which stress is concentrated may be made slightly thicker and/or wider. For example, the portions of the wiring patterns on or in the vicinity of the boundary between the upper side region of the semiconductor chip and the extension portion region may be formed thicker and/or wider.

Figure 8A:
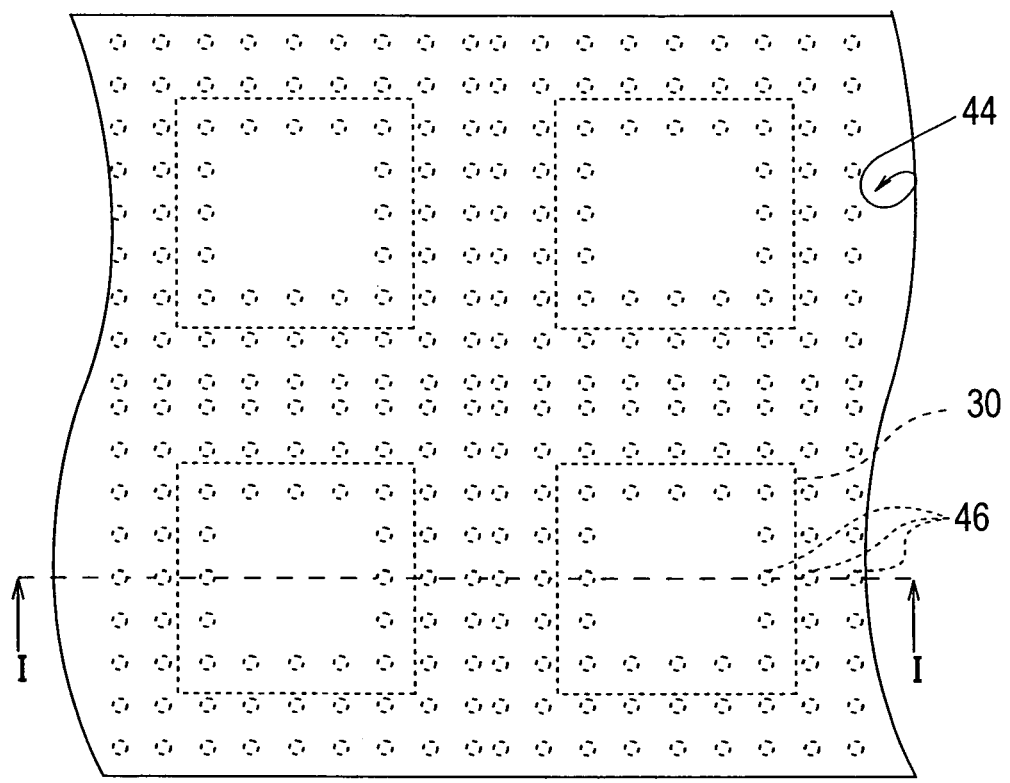
FIGS. 8(A) and 8(B) are a plan view seen from above and a sectional view (4) for illustrating the first manufacturing method of the semiconductor device according to the first embodiment of this invention.
Figure 8B:
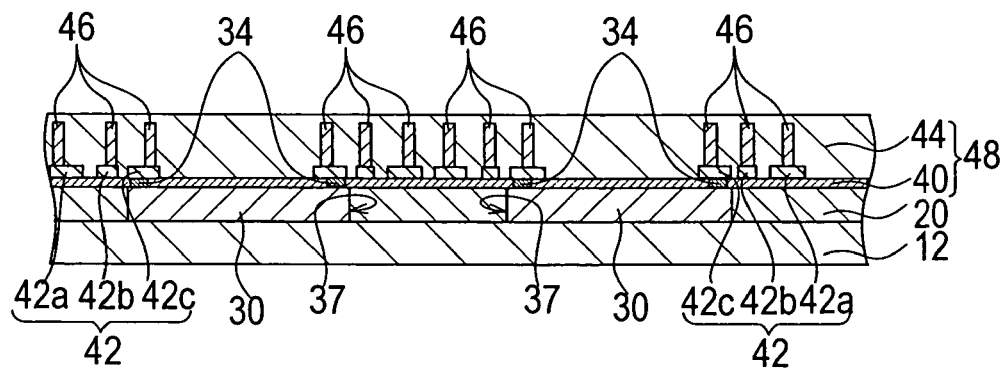

Next, as shown in FIGS. 8(A) and 8(B), electrode posts are formed on the surface of each wiring pattern 42 so as to be electrically connected thereto. The electrode posts 46 are provided on the surface region of the extension portion 21 on the upper side of (directly above) the base frame 20 and on the region near the extension portion 21 on the upper side of (directly above) the semiconductor chip 30. The electrode posts 46 are formed in a lattice formation and arranged at predetermined intervals. As described above, these intervals may be set in consideration of mounting, or in other words as either constant or irregular intervals.

After an appropriate material has been selected, the electrode posts 46 may be formed by means of an electrode post 46 forming process such as plating and photolithography in a well-known WCSP manufacturing process.

A sealing portion 44 is also formed so as to cover the surface of the insulating film 40 on which the wiring patterns 42 and electrode posts 46 are formed. When external terminals are formed without electrode posts 46, the sealing portion 44 is preferably formed such that the parts of each of the wiring pattern 42 at which external terminals are to be formed are exposed.

This sealing process may be implemented by means of a well-known method using a well-known sealing material.

Figure 9A:
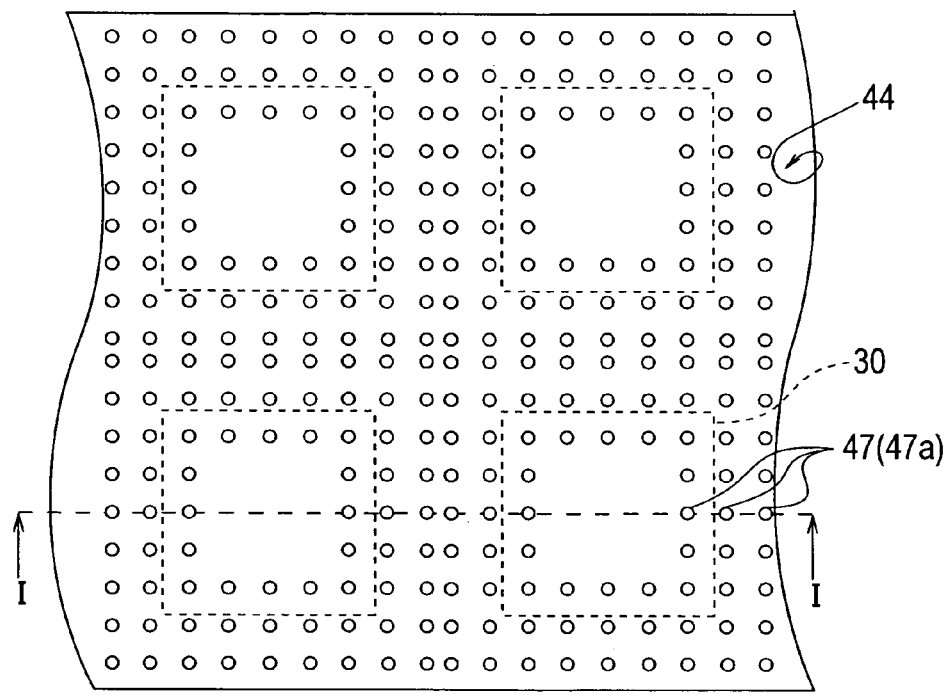
FIGS. 9(A) and 9(B) are a plan view seen from above and a sectional view (5) for illustrating the first manufacturing method of the semiconductor device according to the first embodiment of this invention.
Figure 9B:
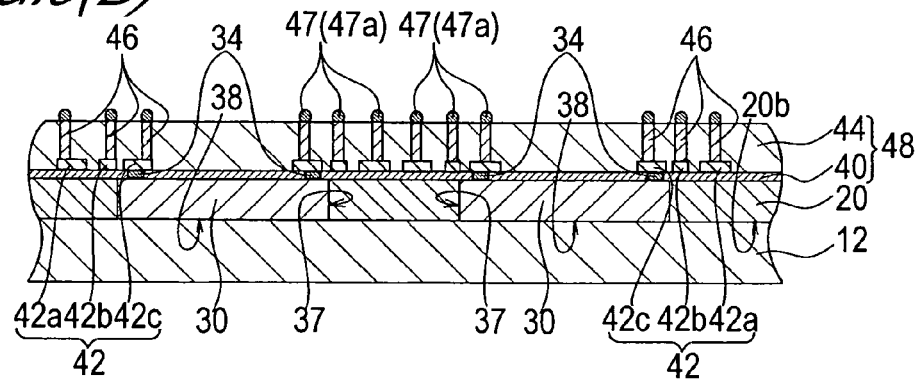

Next, as shown in FIGS. 9(A) and 9(B), the surface side of the sealing portion 44 is trimmed such that the top surface (also referred to as the upper surface) of the electrode posts 46 is exposed.

This process is performed using a well-known grinding or polishing process.

A method such as film formation may also be applied to the formation of the sealing portion 44. In this case, substantially no load is placed on the electrode posts 46. Also in this case, the sealing portion 44 can be formed such that the top surface of the electrode posts 46 is directly exposed on the surface of the sealing portion 44 without the need for a grinding process on the sealing portion 44 as described above. Any suitable processing required from a design point of view may be performed on the exposed top surface of the electrode posts 46. If copper is used as the material for the electrode posts 46, for example, a thin Ni (nickel) film may be formed on the top surface of the electrode posts 46 as a barrier metal layer.

Next, solder balls 47a, for example, are formed as the external terminals 47 on the upper surface of the electrode posts 46 which is exposed from the surface of the sealing portion 44.

Figure 10A:
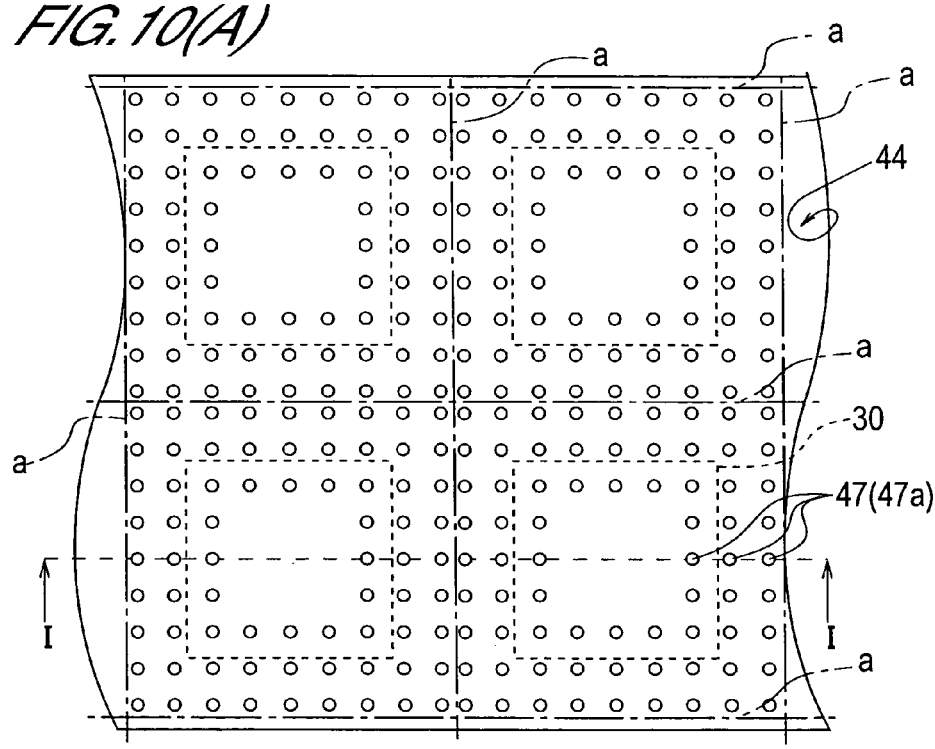
FIGS. 10(A) and 10(B) are a plan view seen from above and a sectional view (6) for illustrating the first manufacturing method of the semiconductor device according to the first embodiment of this invention.
Figure 10B:
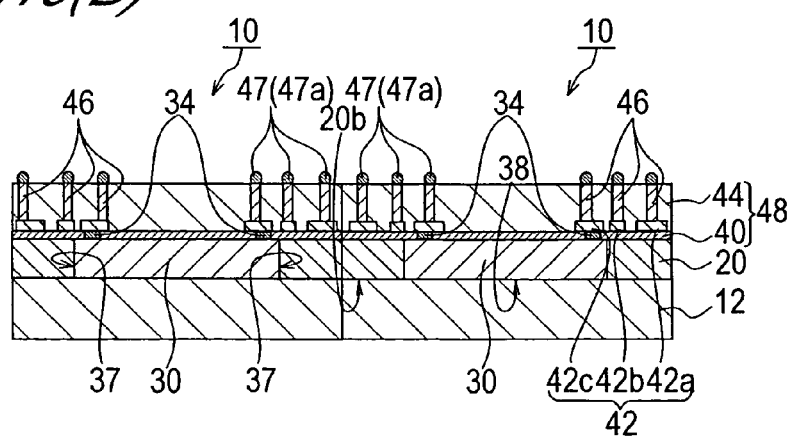

Next, as shown in FIGS. 10(A) and 10(B), the plurality of semiconductor chips are severed along a cutting line shown in the drawings by a dot/dash line a to provide individual constitutional bodies comprising a single semiconductor device having a predetermined function.

This singularization process is preferably performed by cutting using a blade which rotates at high speed. The lower base 12 which is held by adhesion to the second surface 20b of the base frame 20 and second main surface 38 of the semiconductor chip 30 of each divided constitutional body is then removed by being peeled away therefrom.

When the lower base 12 is constituted by peelable adhesion means such as those described above or peelable adhesion means are applied to the lower base 12 in the manufacturing process, the lower base 12 should be peeled away using processing corresponding to the adhesion means such as heating, processing using heated water, or ultraviolet radiation. More specifically, when a thermal release sheet is applied as the lower base 12, for example, the lower base 12 may be peeled away by heating the adhesion means to a predetermined temperature. If ultraviolet curable adhesive is applied as the adhesion means, for example, the lower base 12 maybe removed by curing the adhesive using ultraviolet radiation.

This peeling process may be executed either following the electrode post 46 forming step, following the sealing step, or following the singularization step. Considering the mechanical strength and so on of the extension portion 21, however, peeling is preferably performed at the end of the sealing step.

In the constitutional example described above, a semiconductor device is manufactured by arranging the semiconductor chips 30 in a 2 row×X column (X being a positive number not less than two) lattice formation. This invention is not limited to such an array, however, and a large-number of semiconductor devices may be manufactured simultaneously by providing semiconductor chips in any appropriate array which accords with design specifications.

Since a so-called WCSP manufacturing process can be applied to the first manufacturing method, the semiconductor device of this embodiment can be manufactured by a simple process and without the need for any special semiconductor device manufacturing processes.

Second Manufacturing Method of the First Embodiment

Next, a second manufacturing method for the semiconductor device of the first embodiment will be described with reference to FIGS. 11(A) through 13(B). Note that in the following manufacturing method, the applied materials, process implementation conditions, and so on are similar to those in the first method and hence detailed description thereof has been omitted.

The second manufacturing method differs in that a jig is used to implement each process in place of the lower base 12 described in the first manufacturing method.

First the constitution of a preferred jig to be applied to the second manufacturing method will be described with reference to FIG. 11.

Figure 11A:
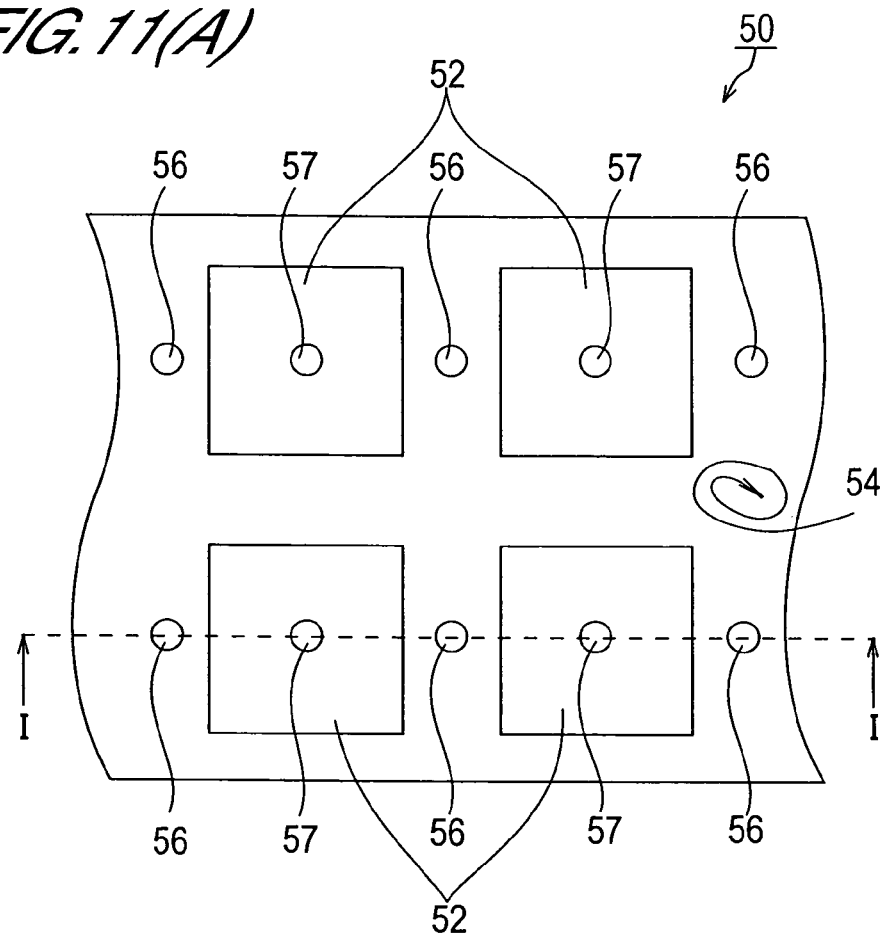
FIG. 11 is a plan view and sectional view of a jig that is preferably used in a manufacturing method for the semiconductor device of this invention.
Figure 11B:
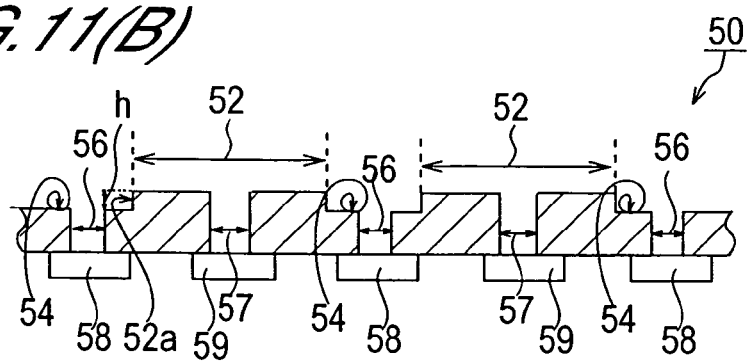

FIG. 11(A) is a partial schematic plan view illustrating the constitution of a preferred jig to be applied to a manufacturing method of the semiconductor device of this invention, and FIG. 11(B) is a view showing in outline a cross section severed along the I—I broken line in FIG. 11(A).

A jig 50 is a tool used in the manufacturing process for supporting or aligning constitutional elements. In this constitutional example, the jig 50 is a pedestal comprising a plurality of convex portions 52 and concave portions 54 positioned in the gaps between the convex portions 52. In this example, the form of each convex portion 52 is a rectangular parallelepiped. The profile and surface area of the surface (also referred to as "top surface" hereinafter) of the convex portion 52 are set to be substantially identical to the surface area of the second main surface 38 of the semiconductor chip 30. The height of the convex portion 52, or in other words a height h of a side wall portion 52a, is preferably set such that when the base frame 20 is fixed on the jig 50 and the semiconductor chip 30 is placed on the surface of the convex portion 52, the first main surface 36 of the semiconductor chip 30 and the first surface 20a of the base frame 20 form a flat plane with no height difference. As noted above, even if a slight height difference exists between the semiconductor chip 30 and base frame 20, this is not problematic as long as the step is within a magnitude range at which there is no danger of a wire disconnection occurring in the subsequently formed wiring patterns.

The jig 50 is preferably appropriately constituted by a material such as a metal or ceramic which has a low adhesiveness in respect of the base frame 20 and/or the semiconductor chip 30, or a material coated with Teflon (registered trademark) or the like which has a low adhesiveness in respect thereof. In so doing, the semiconductor device or unfinished constitutional body may be easily peeled away from the jig 50.

A first throughhole 56 is preferably formed in the concave portion 54 of the jig 50. A first suction and exhaust system 58 for suction-holding the base frame 20 on the concave portion 54 is preferably connected to the first through hole 56. In the drawing, this suction and exhaust system is illustrated as a block.

A second through hole 57 is preferably formed in a similar manner in the convex portion 52. A second suction and exhaust system 59 for suction-holding the semiconductor chip 30 on the convex portion 52 is preferably connected to the second through hole 57. In the drawing, this suction and exhaust system is illustrated by a block.

The first and second suction and exhaust systems 58 and 59 may be constituted by a well-known evacuation system comprising a vacuum pump, piping, and so on, for example. Next, the second manufacturing method using the jig 50 for the semiconductor device of the first embodiment will be described with reference to FIGS. 12 and 13.

Note that in this second manufacturing method, the arrangement constitution of the semiconductor chips in respect of the base frame is similar to that in the first manufacturing method.

First, the jig 50 is prepared as shown in FIG. 11 and as described above.

Figure 12A:
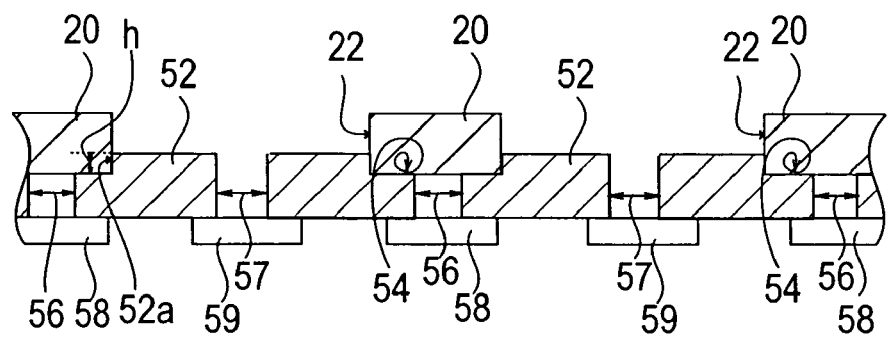
FIG. 12 is a sectional view (1) for illustrating a second manufacturing method for the semiconductor device according to the first embodiment of this invention.

Then, as shown in FIG. 12(A), the base frame 20 is placed on the bottom surface of the concave portion 54 of the jig 50 so as to envelop the side wall portions 52a of the convex portion 52 and such that the surface of the convex portion 52 is exposed in the opening portion 22.

Here, when the first through hole 56 is provided in the concave portion 54 of the jig 50 and the first suction and exhaust system 58 is connected to the first through hole 56 as described above, air is evacuated from the contact surface (gap) between the second surface 20b of the base frame 20 and the surface of the concave portion 54, whereby the base frame 20 is suction-held on the jig 50.

Figure 12B:
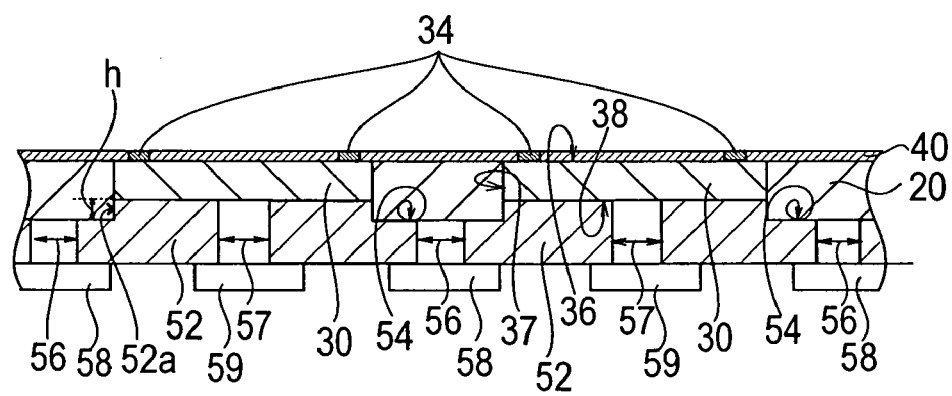

Next, as shown in FIG. 12(B), the second main surface 38 of the semiconductor chip 30 is disposed on the convex portion 52 which is in the opening portion 22 of the base frame 20 so as to surface the surface of the convex portion 52.

At this time, if the inside walls 24 of the opening portion 22 in the base frame 20 have an inclined plane which tapers, or grows thinner, toward the semiconductor chip 30 as has already been explained with reference to FIG. 3, the semiconductor chip 30 can be disposed by sliding the chip along this inclined plane.

When the second through hole 57 is provided in the convex portion 52 and the second suction and exhaust system 59 is connected to this through hole 57 as described above, air is evacuated from the contact surface between the second main surface 38 of the semiconductor chip 30 and the surface of the convex portion 52 such that the semiconductor chip 30 is suction-held on the jig 50.

The degree of evacuation required for suction-holding the base frame 20 or semiconductor chip 30 on the jig 50 should be sufficient to enable the base frame 20 or semiconductor chip 30 to be held with stability.

Next, the insulating film 40 is formed on the surface of the base frame 20 and the first main surface 36 of the semiconductor chip 30, which are disposed on the jig 50, such that the top surface of the electrode pads 34 provided on the semiconductor chip 30 is exposed (see FIG. 12(B)).

Here, a process similar to that described in the first method may be employed such that the insulating film 40 is formed so as to cover the electrode pads 34, whereupon the top surface of the electrode pads 34 is exposed. As in the first method, the insulating film 40 is preferably formed flat.

If a slight gap exists between the base frame 20 and semiconductor chip 30, the insulating film 40 is formed by inserting the insulating material used to form the insulating film 40 into the gap such that the base frame 20 and semiconductor chip 30 are integrally fixed.

Figure 12C:
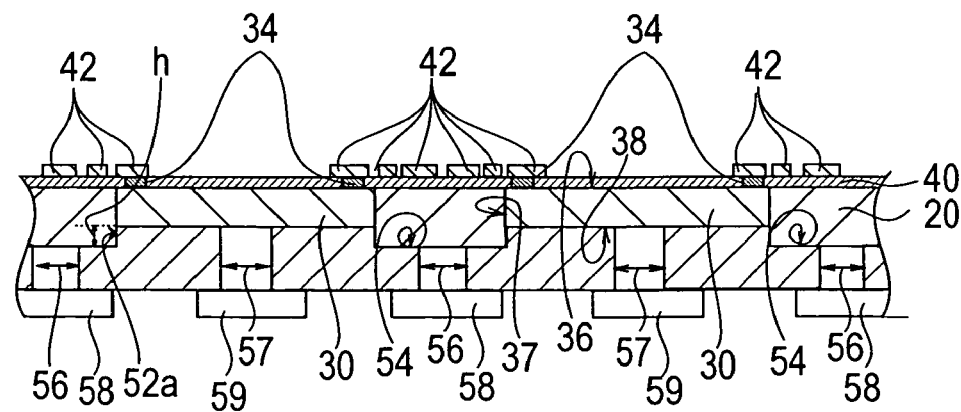

Next, as shown in FIG. 12(C), a plurality of wiring patterns 42 are formed on the surface of the insulating film 40 so as to form an electrical connection with the top surface of each electrode pad 34. In this case, as in the first manufacturing method, one-on-one connection relationships of one wiring pattern to one electrode pad 34 are established. Next, one electrode post 46 is formed on and connected to each wiring pattern 42. The electrode posts 46 are provided in the region of the extension portion 21 on the upper side of (directly above) the base frame 20 and in the region on the upper side of (directly above) the semiconductor chip 30 in the vicinity of the extension portion 21.

Figure 13A:
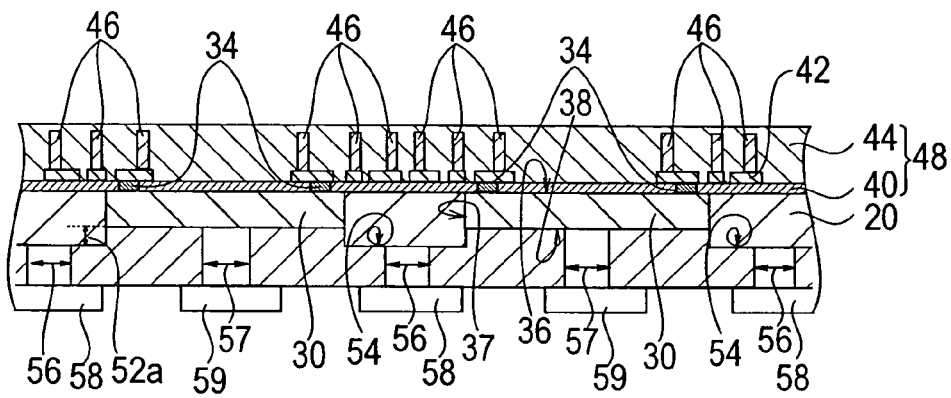
FIG. 13 is a sectional view (2) for illustrating the second manufacturing method of the semiconductor device according to the first embodiment of this invention.

Next, as shown in FIG. 13(A), the sealing portion 44 is formed so as to cover the surface of the insulating film 40 on which the wiring patterns 42 and electrode posts 46 are formed.

Figure 13B:
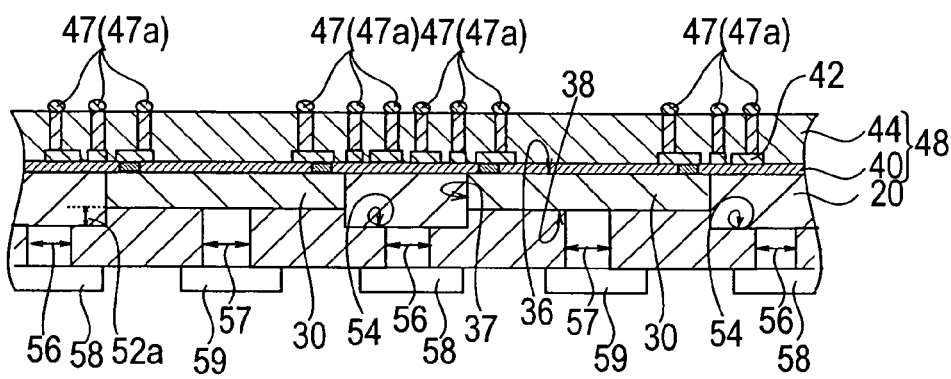

As shown in FIG. 13(B), the top surface of the electrode posts 46 is exposed on the surface of the sealing portion 44 by grinding away the surface of the sealing portion 44.

Solder balls 47a are then formed as external terminals 47 on the top surface of the exposed electrode posts 46.

Figure 13C:
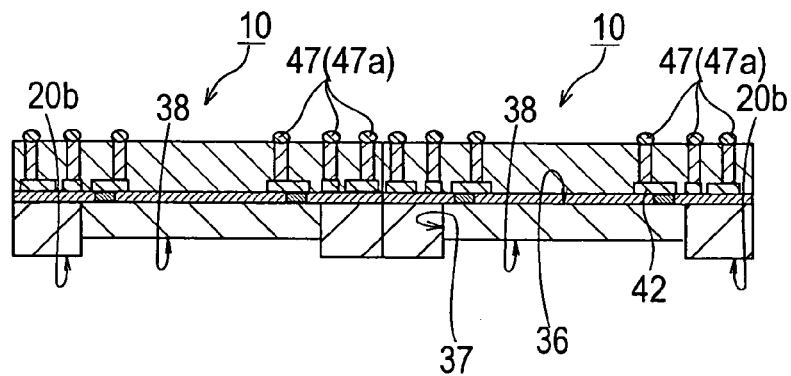

Next, as shown in FIG. 13(C), the jig 50 is peeled away from the second surface 20b of the base frame 20 and the second main surface 38 of the semiconductor chip 30 following release of the vacuum when vacuum suction means are employed.

The base frame 20 and sealing portion 44 are then severed between a plurality of semiconductor chips 30 to form individual semiconductor devices.

By means of such a process, a semiconductor device having a similar constitution to that described in the first manufacturing method is manufactured.

Note that in the semiconductor device manufactured according to the second manufacturing method, a step is produced by the convex portion 52 of the jig 50 on the bottom surface side of the semiconductor device, or more specifically between the second surface 20b of the base frame 20 and the second main surface 38. If not desired, however, no further processing is necessary.

According to the second manufacturing method, the jig can be used repeatedly. Since there is no need to use a lower base as in the first manufacturing method, the number of members required in the manufacturing process can be reduced. As a result, a reduction in manufacturing costs can be expected. Further, when the base frame and/or semiconductor chip are suction-held by a suction and exhaust system via a through hole, holding the base frame and semiconductor chip on the jig and removing them therefrom can be performed easily and speedily such that an increase in throughput can be expected.

Second Embodiment

A semiconductor device according to a second embodiment of this invention will now be described with reference to FIGS. 14(A), 14 (B), and 15(A). Note that since the plan views seen from above in the description of the second embodiment are substantially identical to the plan views already described in the first embodiment, description thereof has been omitted and the second embodiment will be described using sectional views only. Further, applied materials, process implementation conditions, and so on are similar to those of the first embodiment, and hence detailed description thereof has also been omitted.

Figure 14A:
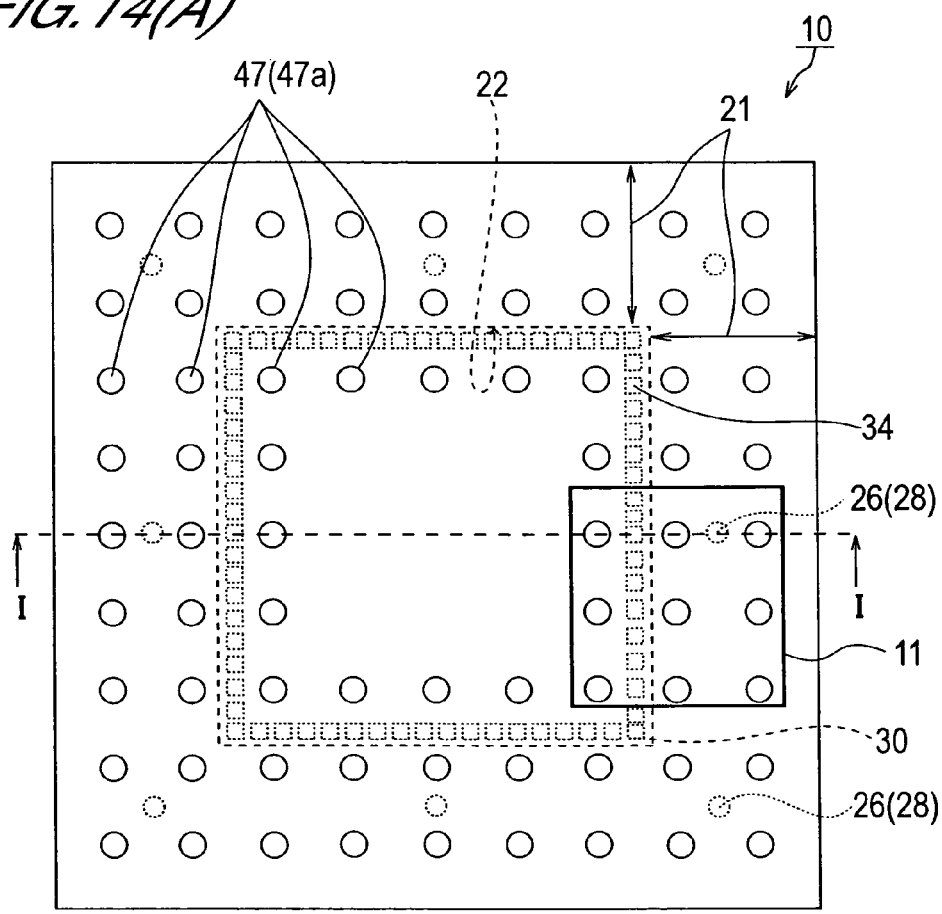
FIG. 14(A) is a plan view seen from above showing in outline the constitution of a semiconductor device of a second embodiment.
Figure 14B:
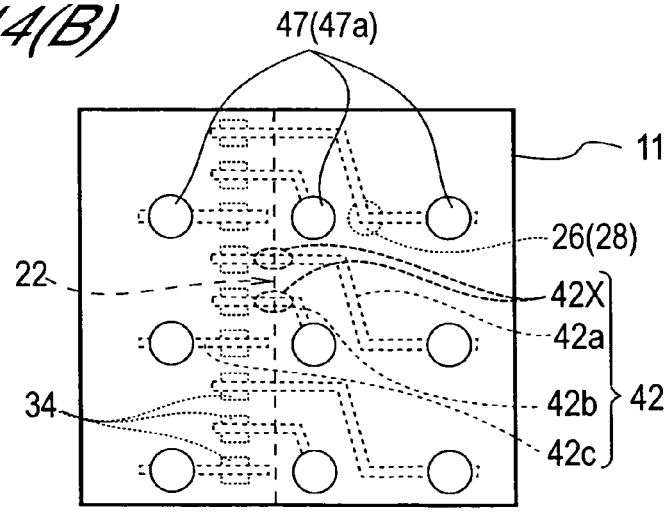
FIG. 14(B) is a plan view showing an expanded outline of the main parts of one region of FIG. 14(A) in order to illustrate the connection relationship between a wiring pattern and electrode pads.

FIG. 14(A) is a schematic plan view showing the constitution of the semiconductor device of the second embodiment, and FIG. 14(B) is a plan view showing an expanded outline of the main parts of the region in 14(A) which is surrounded by a solid line 11 in order to illustrate the connection relationship between a wiring pattern, electrode pads, and an inter-layer wire connection (through hole).

Figure 15A:
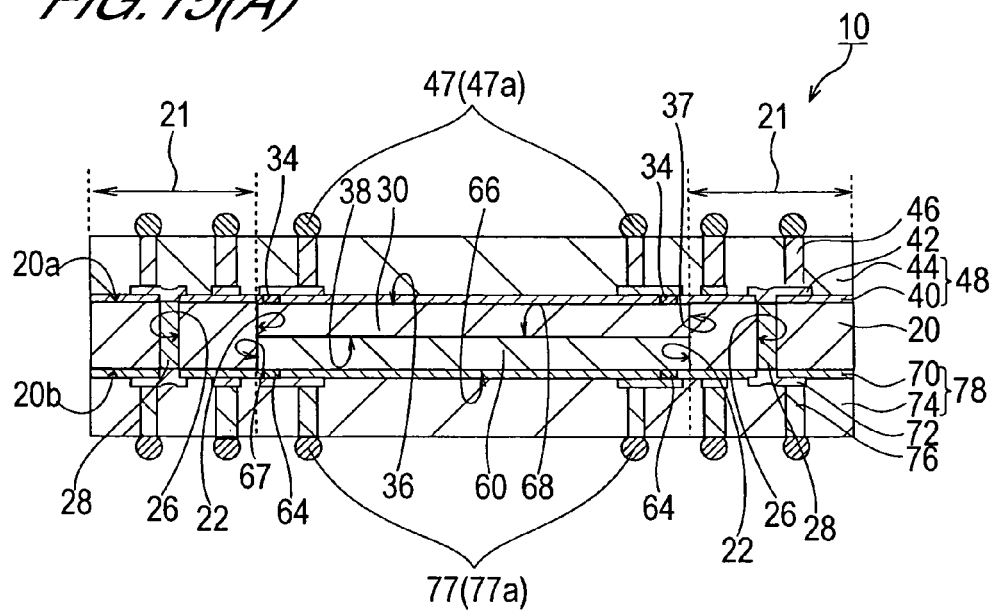
FIG. 15(A) is a sectional view showing in outline the constitution of the semiconductor device of the second embodiment.

FIG. 15(A) is a sectional view for illustrating the constitution of the semiconductor device of the second embodiment, and is a schematic sectional view showing a cross section severed along the I—I broken line in FIG. 14(A).

A semiconductor device 10 according to the second embodiment of this invention comprises a base frame 20 having an opening portion 22 which is a through hole passing from a first surface 20a to a second surface 20b in a similar fashion to the first embodiment. A region corresponding to the upper side of the first surface 20a and the upper side of the second surface 20b of the base frame 20 is an extension portion 21.

The opening portion 22 is formed as a through hole in the base frame 20. The magnitude of this opening portion 22 is set to be identical to or slightly larger than the space required by a stacked body comprising a first semiconductor chip 30 and a second semiconductor chip 60. The height of the opening portion 22, that is the thickness of the base frame 20, is preferably set to be substantially equal to the total thickness of the stacked first and second semiconductor chips 30 and 60. If, for example, the first and second semiconductor chips 30 and 60 are adhered to each other using an adhesive or the like, the thickness of the first semiconductor chip 30 and/or the second semiconductor chip 60 is preferably adjusted by polishing, grinding, or a similar process. If the thickness of the base frame 20 may be adjusted, however, the height of the opening portion 22 can be set equal to the total thickness of the first semiconductor chip 30 and second semiconductor chip 60 to be disposed within the opening portion 22 at a later stage. If the first semiconductor chip 30 and second semiconductor chip 60 are adhered to each other using an adhesive, the height of the opening portion 22, or in other words the thickness of the base frame 20, should be set in consideration of the thickness of the adhesive.

A through hole 26 other than the opening portion 22 may be formed as desired in the base frame 20. This through hole 26 is provided to produce electrical continuity between the surface side and rear surface side of the base frame 20. In this constitutional example, a plurality of through holes 26 is formed around the peripheral edge of the base frame 20.

An inter-layer wiring 28 is formed from an appropriate conductive material such as an aluminum alloy or tungsten alloy, for example, in the interior of the through holes 26 for attaining electrical continuity according to a commonplace method.

The first semiconductor chip 30 and second semiconductor chip 60 are provided within the opening portion 22 such that a second main surface 38 of the former and a fourth main surface 68 of the latter contact each other.

The first semiconductor chip 30 comprises a first circuit element (not shown) having a predetermined function and a first main surface 36 provided with a plurality of first electrode pads 34 which are electrically connected to the first circuit element. The first electrode pads 34 are provided in a plurality around the peripheral edge of the first main surface 36. The first semiconductor chip 30 comprises the first main surface 36, the second main surface 38 which opposes the first main surface 36, and one, two, or more side surfaces 37 existing between the first main surface 36 and second main surface 38. The first semiconductor chip 30 is provided within the opening portion 22 such that the first main surface 36 becomes the upper surface. Similarly to the first embodiment, the first semiconductor chip 30 is preferably provided within the opening portion 22 such that the level of the first surface 20a of the base frame 20 is substantially equal to the level of the first main surface 36 of the first semiconductor chip 30.

Likewise, the second semiconductor chip 60 comprises a second circuit element (not shown) having a predetermined function, a third main surface 66, the fourth main surface 68 which opposes the third main surface 66, and one, two, or more side surfaces 67 which exist between the third main surface 66 and fourth main surface 68. The second semiconductor chip 60 is also provided with a plurality of second electrode pads 64 which are electrically connected to the second circuit element. The second electrode pads 64 are provided in a plurality around the peripheral edge of the third main surface 66.

The second semiconductor chip 60 is provided within the opening portion 22 such that the third main surface 66 thereof faces downward and the level of the second surface 20b of the base frame 20 is substantially equal to the level of the third main surface 66 of the second semiconductor chip 60. Here, the second main surface 38 of the first semiconductor chip 30 and the fourth main surface 68 of the second semiconductor chip 60 are preferably adhered to each other and fixed using an adhesive or the like.

A first insulating film 40 is formed on the first surface 20a of the base frame 20 and the first main surface 36 of the first semiconductor chip 30 such that a part of the first electrode pads 34 and one end portion of the inter-layer wiring 28 are exposed.

A second insulating film 70 is similarly formed on the second surface 20b of the base frame 20 and the third main surface 66 of the second semiconductor chip 60 such that a part of each of the second electrode pads 64 and the other end portion of the inter-layer wiring 28 are exposed.

A plurality of first wiring patterns 42 is formed on the surface of the first insulating film 40 and electrically connected to the exposed part of the first electrode pads 34 and/or the exposed one end portion of the inter-layer wiring 28.

Similarly, a plurality of second wiring patterns 72 is formed on the surface of the second insulating film 70 and electrically connected to the exposed part of the second electrode pads 64 and/or the exposed other end portion of the inter-layer wiring 28.

The first wiring patterns 42 include wiring patterns that provided so as to straddle the boundary between a region on the first semiconductor chip 30 and a region on the first surface 20a of the base frame 20.

Similarly, the second wiring patterns 72 are provided so as to straddle the boundary between a region on the second semiconductor chip 60 and a region on the second surface 20b of the base frame 20.

Since the first and second wiring patterns 42 and 72 are formed so as to straddle the boundary between the region on the upper side of (directly above) the first surface 20a of the base frame 20 or the second surface 20b of the base frame 20 and on the upper side of (directly above) the first semiconductor chip 30 or the second semiconductor chip 60 respectively, the portions 42X (and 72X (not shown)) of the first and second wiring patterns 42 and 72 on or in the vicinity of these boundaries (22) are preferably formed over a certain length and of thicker wire. In other word, The portions 42X of the wiring patterns 42 on a boundary and vicinity thereof between a region on the upper side of said semiconductor chip 30 and the base flame 20 are formed wider or more thickly than other portions of said wiring patterns 42.

Here, when the inter-layer wire connection 28 exists, one end portion thereof is electrically connected to the first wiring pattern 42 and the other end portion thereof is electrically connected to the second wiring pattern 72. Thus an output signal of the first semiconductor chip 30 and an output signal of the second semiconductor chip 60 can be outputted to the rear surface (lower surface) side of the semiconductor device 10 and the surface (upper surface) of the semiconductor device 10 respectively. For example, an output signal of the second semiconductor chip 60 can be inputted into the first semiconductor chip 30 via the first wiring pattern 42.

First and second sealing portions 44 and 74 are formed on the surface of first and second insulating films 40 and 70 on which the first and second wiring patterns 42 and 72 are formed such that a part of each of the first and second wiring patterns 42 and 72 is exposed. The first insulating film 40 and first sealing portion 44 may be referred to collectively as a first insulation layer 48 and the second insulating film 70 and second sealing portion 74 may be referred to collectively as a second insulation layer 78. Here, the part of the first and second wiring patterns 42 and 72 which is connected to the inter-layer wiring 28 may also be exposed.

Then, first and second external terminals 47 and 77 are connected on the upper side of (directly above) the first surface 20a and second surface 20b of the base frame 20 above the exposed first and second wiring patterns 42 and 72, or in other words in a region including the extension portion 21.

For example, a plurality of first and second external terminals 47 and 77 are formed using first and second solder balls 47a and 77a via first and second electrode posts 46 and 76 respectively.

Here, external terminals may also be connected to the first and second wiring patterns 42 and 72 which are connected to the inter-layer wiring 28. For example, the first wiring pattern 42 which is connected to the first electrode pads 34 is connected to the inter-layer wiring 28 instead of an external terminal, and through the inter-layer wiring 28 and the second wiring pattern 72 which is not connected to the second electrode pads 64, an external terminal can be formed on the second wiring pattern 72. An external terminal can also be directly connected to the inter-layer wiring (through hole) 28.

The spacing between adjacent first electrode posts 46 and adjacent second electrode posts 76 may be determined appropriately as desired in consideration of mounting onto a printed board or the like.

The first and second electrode posts 46 and 76 may be provided not only within a surface area range corresponding to the first and third main surfaces 36 and 66 of the first and second semiconductor chips 30 and 60, but also in the region including the first surface 20a and second surface 20b of the base frame 20, or in other words the extension portion 21. As a result, the design freedom of the disposal positions and disposal pitch of the first and second electrode posts 46 and 76 increases. More specifically, restrictions on the disposal pitch of the first and second electrode posts 46 and 76, or in other words the first and second external terminals 47 and 77, are eased such that the external terminals can be formed at wider intervals in accordance with requirements on the mounting substrate side, for example. As a result, the semiconductor device 10 can be more easily mounted on a mounting substrate.

According to the semiconductor device of the second embodiment, in addition to similar effects to the first embodiment, two semiconductor chips can be directly stacked such that the semiconductor device can be made thinner. Also, two semiconductor chips can be connected via a through hole, for example, and thus an input signal to one of the semiconductor chips or an output signal from one of the semiconductor chips, for example, can be inputted or outputted directly to or from the semiconductor device on the opposite side without passing through conventionally used and highly problematic metal wires. As a result, a further increase in the operating speed and number of functions of the semiconductor device can be realized.

A further increase in the operating speed and number of functions can be easily realized when a plurality of the semiconductor devices of the second embodiment are stacked by connecting the external terminals thereof to form stacking terminals. Since these stacking terminals can also be disposed in the so-called fan-in portion, the package may be further reduced in size and thickness.

Modified Example of the Semiconductor Device of the Second Embodiment

A modified example of the semiconductor device of the second embodiment will now be described with reference to FIG. 15(B). Note that the plan view seen from above thereof is similar to FIG. 14(A) and hence detailed description has been omitted.

Figure 15B:
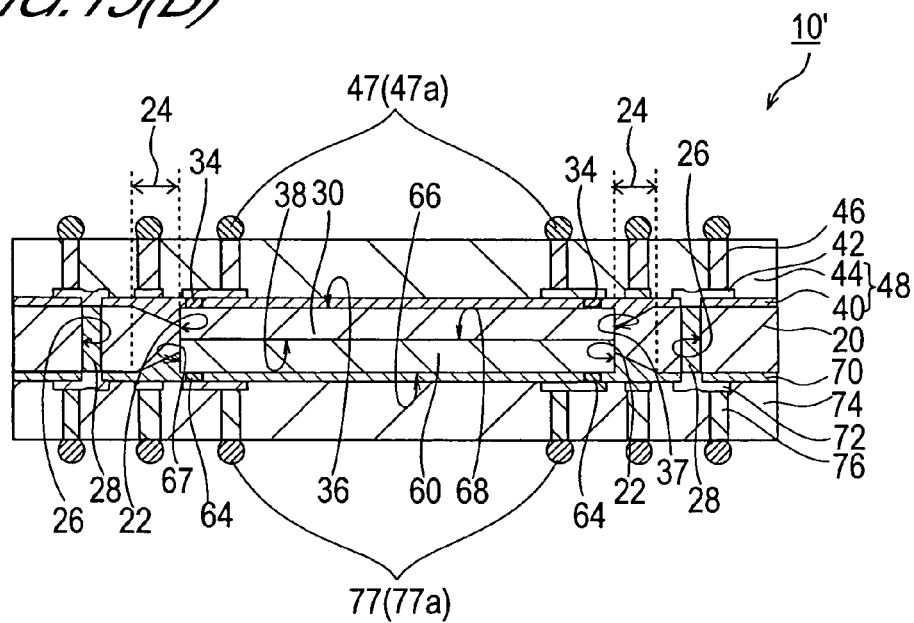
FIG. 15(B) is a schematic sectional view of a modified example of the second embodiment.

FIG. 15(B) is a schematic sectional view showing a transverse section of a semiconductor device 10' according to a modified example of the second embodiment.

The semiconductor device 10' of this modified example differs in the form of inner walls 24 of the opening portion 22 in the base frame 20. Accordingly, other similar constitutional components to the first and second embodiments are allocated and illustrated with identical reference symbols and duplicate description thereof has been omitted.

In the semiconductor device 10' of this modified example, the cross-sectional form of the inner walls 24 which define the opening portion 22 of the base frame 20 tapers, or grows thinner, toward the distal end of the walls 24 from both surface sides of the base frame 20 to the semiconductor chip side. More specifically, the thickness of the inner walls 24 decreases from both the first surface 20a and second surface 20b sides of the base frame 20 toward the side surface of the first and second semiconductor chips 30 and 60 provided within the opening portion 22.

By forming the inner walls 24 in this manner, in addition to the working effects of the semiconductor device described in the second embodiment, advantageous effects (to be described hereinafter) can be obtained particularly in the manufacturing process.

Manufacturing Method of the Second Embodiment

Next, a manufacturing method for the semiconductor device of the second embodiment will be described with reference to FIGS. 16(A) through 18(C). Note that in these drawings, the plan views are substantially identical to those used in the first embodiment and hence illustration and detailed description thereof have been omitted. Applied materials, process implementation conditions, and so on are also similar to those of the first embodiment and hence detailed description thereof has also been omitted.

Each drawing is a schematic sectional view showing a transverse section of a constitutional body which is a semiconductor device during manufacture. Note that in each of the following manufacturing processes, applied materials, process implementation conditions, and so on are similar to those of the manufacturing methods of the first embodiment and hence detailed description thereof has been omitted.

In the manufacturing method for the semiconductor device of the second embodiment, as in the second manufacturing method of the first embodiment described above, a jig is used to implement a part of the manufacturing processes.

First, a preferable jig for application to the manufacturing method of the second embodiment will be described. Note, however, that this jig has a substantially identical constitution to and is constituted by the same materials as the jig 50 already described with reference to FIG. 11 and hence detailed description thereof has been omitted. This identical constitution will be described using identical reference symbols with reference to FIGS. 11(A) and 11(B).

The jig 50 which is preferably applied to the manufacturing method of the second embodiment is similar to that of the first embodiment in that it comprises a plurality of convex portions 52 and concave portions 54 which are positioned in the gaps between these convex portions 52. The jig 50 is also similar in that the profile and surface area of the surface region of each convex portion 52 at least matches, or in other words is identical to, the profile and surface area of the second main surface 38 of the semiconductor chip 30. The jig 50 which is preferably applied to the manufacturing method for the semiconductor device of the second embodiment differs in the height of the convex portion 52, that is a height h of side wall portions 52a.

Specifically, the height h of the side wall portions 52a is set such that when the base frame 20 is placed on the concave portion 54 of the jig 50 and the first semiconductor chip 30 is placed on the surface of the convex portion 52 in a manufacturing process, the level of the first main surface 36 of the first semiconductor chip 30 is substantially equal to the level of the first surface 20a of the base frame 20.

As noted above, there is no particular problem even if a slight height difference exists at this time between the first semiconductor chip 30 and the base frame 20 as long as problems such as wire pattern disconnection do not occur as a result of this height difference.

Similarly to that of the jig described in the first embodiment, the first through hole 56 is preferably formed in the concave portion 54 and/or the second through hole 57 is preferably formed in the convex portion 52. Also, the first and second suction and exhaust systems 58 and 59 are preferably connected to the first through hole 56 and second through hole 57 respectively for suction-holding the base frame 20 on the concave portion 54 and the semiconductor chip 30 on the convex portion 52.

Next, the manufacturing method using the jig 50 for the semiconductor device of the second embodiment will be described.

First, the jig 50 having the constitution described above is prepared.

Figure 16A:
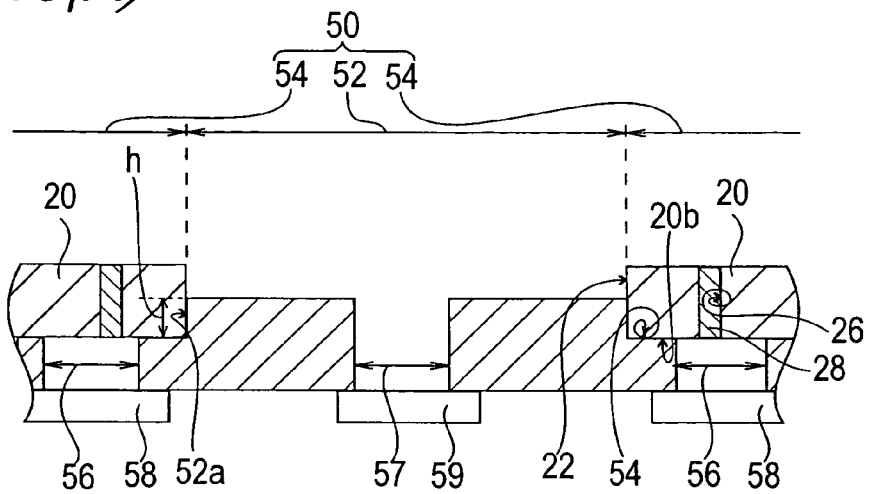
FIG. 16 is a sectional view (1) for illustrating a manufacturing method for the semiconductor device according to the second embodiment of this invention.

Then, as shown in FIG. 16(A), the base frame 20 having a plurality of opening portions 22, which are through holes for exposing the surface of the convex portion 52, is placed on the concave portion 54 of the jig 50 so as to envelop the side wall portions 52a of the convex portion 52.

When the through hole 26 is formed in the base frame 20 as described with reference to FIGS. 15(A) and 15(B), the interior of the through hole 26 is formed as the inter-layer wiring 28 from a conductive material such as an aluminum alloy or tungsten alloy, for example, for attaining electrical continuity according to a commonplace method.

As noted above, when the first throughhole 56 is provided in the concave portion 54 and the first suction and exhaust system 58 is connected thereto, air is evacuated from the contact surface (gap) between the second surface 20b of the base frame 20 and the surface of the concave portion 54 such that the base frame 20 is suction-held thereon.

Figure 16B:
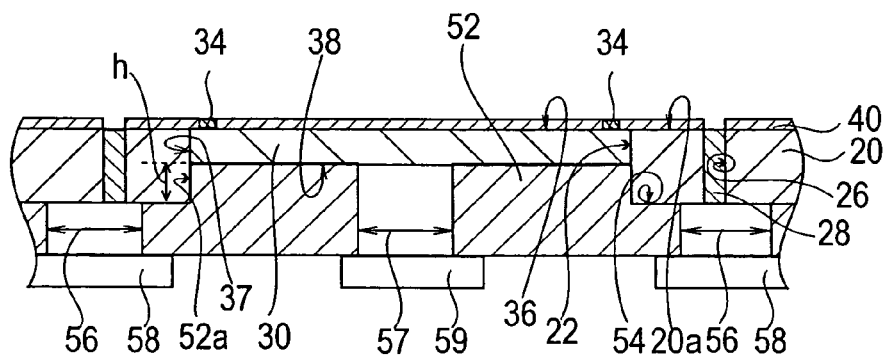

Next, as shown in FIG. 16(B), the second main surface 38 of the first semiconductor chip 30 is disposed on the convex portion 52 inside the opening portion 22 of the base frame 20 so as to face the convex portion 52.

Here, when the inner walls 24 of the opening portion 22 in the base frame 20 are inclined as described with reference to FIG. 15(B), the first semiconductor chip 30 is disposed by sliding the chip along the inclined surface.

When the second through hole 57 is provided in the convex portion 52 and the second suction and exhaust system 59 is connected thereto as described above, air is evacuated from the contact surface between the second main surface 38 of the first semiconductor chip 30 and the surface of the convex portion 52 such that the first semiconductor chip 30 is suction-held thereon.

Next, the first insulating film 40 is formed on the first surface 20a of the base frame 20 disposed on the jig 50 and the first main surface 36 of the first semiconductor chip 30 such that a part of the first electrode pads 34 is exposed. Here, if the inter-layer wiring 28 is formed (see FIGS. 15(A), 15(B)), the first insulating film 40 is formed such that the inter-layer wiring 28 is exposed.

As described in relation to the first embodiment, the first insulating film 40 may be initially formed to cover the first electrode pads 34 and inter-layer wiring 28, whereupon the first electrode pads 34 and inter-layer wiring 28 are exposed. As in the first embodiment, the first insulating film 40 is preferably formed flat.

If a slight gap exists between the base frame 20 and first semiconductor chip 30, the insulating material used to form the first insulating film 40 is inserted into the gap, whereby the first insulating film 40 is formed such that the base frame 20 and first semiconductor chip 30 are integrally fixed.

Figure 16C:
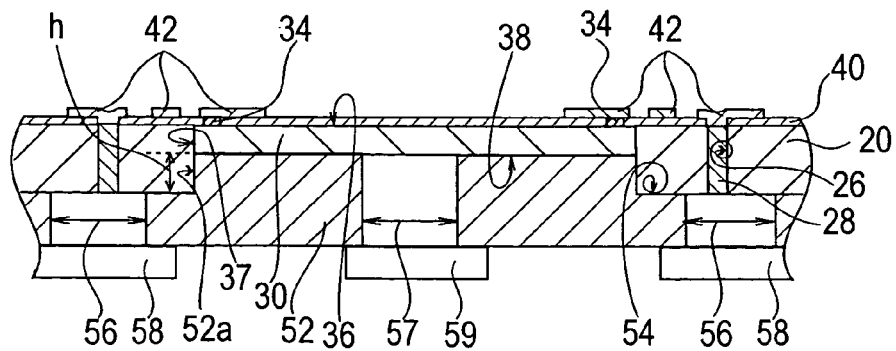

Next, as shown in FIG. 16(C), the first wiring pattern 42 comprising a plurality of wiring patterns is formed on the surface of the first insulating film 40. Some of the wiring patterns are electrically connected to a part of the exposed first electrode pads 34. If the inter-layer wiring 28 exists, the first electrode pads 34 and inter-layer wiring 28 may also be electrically connected via the first wiring pattern 42 at this time.

Figure 17A:
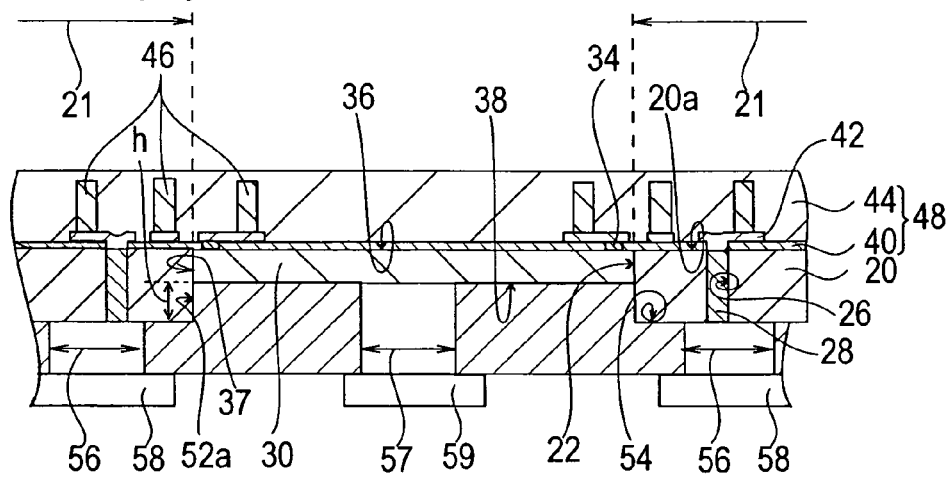
FIG. 17 is a sectional view (2) for illustrating the manufacturing method of the semiconductor device according to the second embodiment of this invention.

Next, as shown in FIG. 17(A), electrode posts 46 are formed on the first wiring pattern 42. As in the first embodiment, as a rule one electrode post is provided for one wiring pattern. These electrode posts 46 are formed not only on the wiring patterns on the upper side of the semiconductor chip 30, but a plurality of electrode posts 46 is also formed in a region corresponding to the upper side of (directly above) the first surface 20a of the base frame 20, or in other words in the region which functions as the extension portion 21.

Next, the first sealing portion 44 is formed to cover the surface of the first insulating film 40 on which the first wiring pattern 42 and first electrode posts 46 are formed.

A sealing portion is then formed by a similar process on the third main surface 66 side of the second semiconductor chip 60. That is, the base frame 20 having the first semiconductor chip 30 provided inside the opening portion 22 thereof is removed from the jig 50 and the constitutional body is turned over such that the third main surface 66 of the second semiconductor chip 60 becomes the upper surface.

Figure 17B:
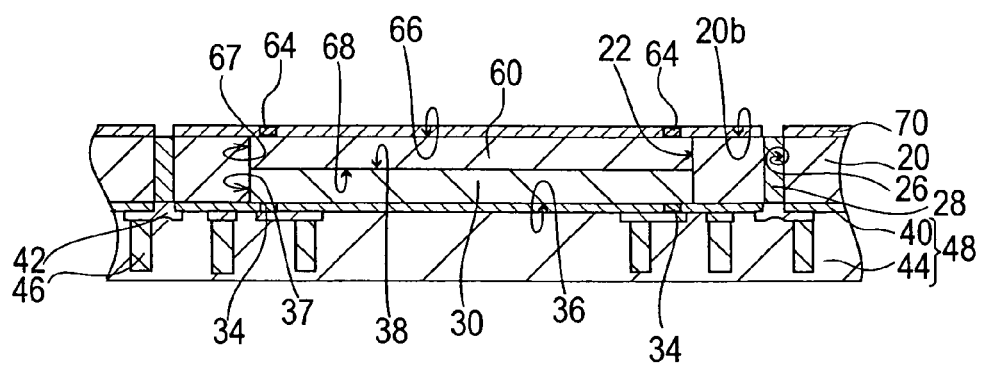

As shown in FIG. 17(B), the second semiconductor chip 60 is disposed on the second main surface 38 of the first semiconductor chip 30 inside the opening portion 22 such that the fourth main surface 68 of the second semiconductor chip 60 faces the second main surface 38.

Here, the second main surface 38 of the first semiconductor chip 30 and the fourth main surface 68 of the second semiconductor chip 60 are preferably adhered together by an adhesive or the like.

If the level of the third main surface 66 of the second semiconductor chip 60 and the level of the second surface 20b of the base frame 20 do not align, the level of the third main surface 66 of the second semiconductor chip 60 and the level of the second surface 20b of the base frame 20 may be adjusted to become substantially equal by inserting a type of spacer member between the first semiconductor chip 30 and the fourth main surface 68 of the second semiconductor chip 60 or by adjusting the thickness of the adhesive or the like.

As noted above, the semiconductor device according to the second embodiment of this invention is also applicable when there is a difference in the planar sizes of the first semiconductor chip 30 and second semiconductor chip 60, or in other words between the first and third main surfaces and the second and fourth main surfaces. Here, the size of the gap between the base frame 20 and first semiconductor chip 30 or second semiconductor chip 60 is set in a magnitude range within which the subsequently formed second wiring pattern 72 may be formed.

Hence, as long as a height difference or gap which forms between the base frame 20 and the first semiconductor chip 30 or second semiconductor chip 60 is within a range at which the subsequently formed second wiring pattern 72 can be formed without problems, no adjustment thereof by means of further processing is necessary.

Next, the second insulating film 70, second electrode pads 64, and if required the inter-layer wire connection 28 are formed so as to be exposed on the second surface 20b of the base frame 20 and the third main surface 66 of the semiconductor chip 60.

Figure 17C:
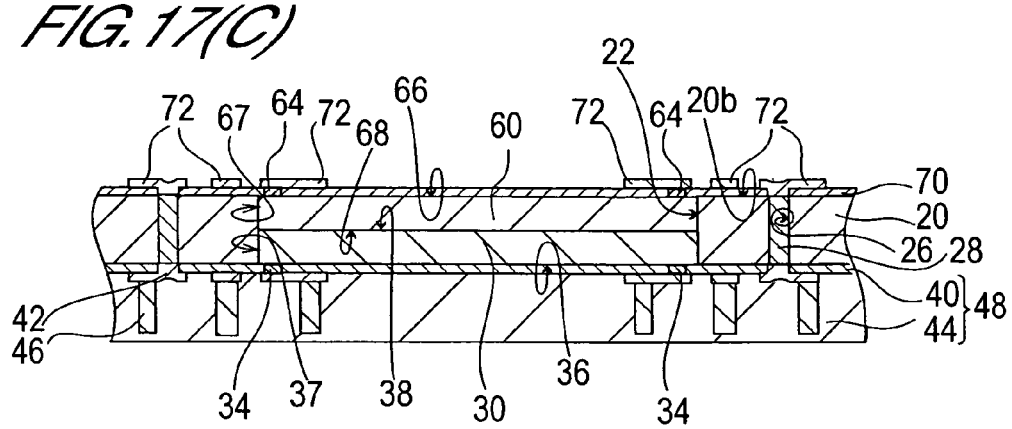

Then, as shown in FIG. 17(C), a plurality of second wiring patterns 72 is formed on the surface of the second insulating film 70 and electrically connected to the exposed part of the second electrode pads 64. Here, if the inter-layer wire connection 28 exists, the second electrode pads 64 and inter-layer wiring 28 may also be electrically connected via the second wiring patterns 72.

The second wiring patterns 72 are also formed on the upper side of (directly above) the second semiconductor chip 60 and the upper side of (directly above) the second surface 20b of the base frame 20.

Figure 18A:
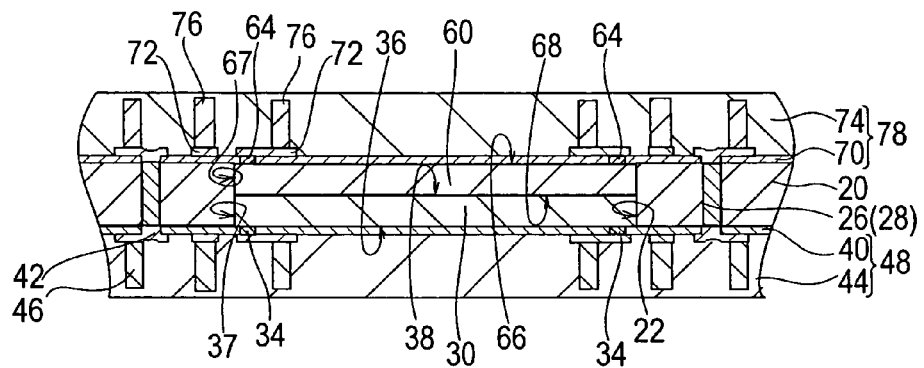
FIG. 18 is a sectional view (3) for illustrating the manufacturing method of the semiconductor device according to the second embodiment of this invention.

Next, as shown in FIG. 18(A), the second electrode posts 76 are formed on the second wiring patterns 72. The second electrode posts 76 are also provided one-to-one with the second wiring patterns 72. The second electrode posts 76 are formed not only on the second wiring patterns 72 on the upper side of the second semiconductor chip 60 but also on the wiring patterns 72 in the region on the upper side of (directly above) the second surface 20b of the base frame 20.

Figure 18B:
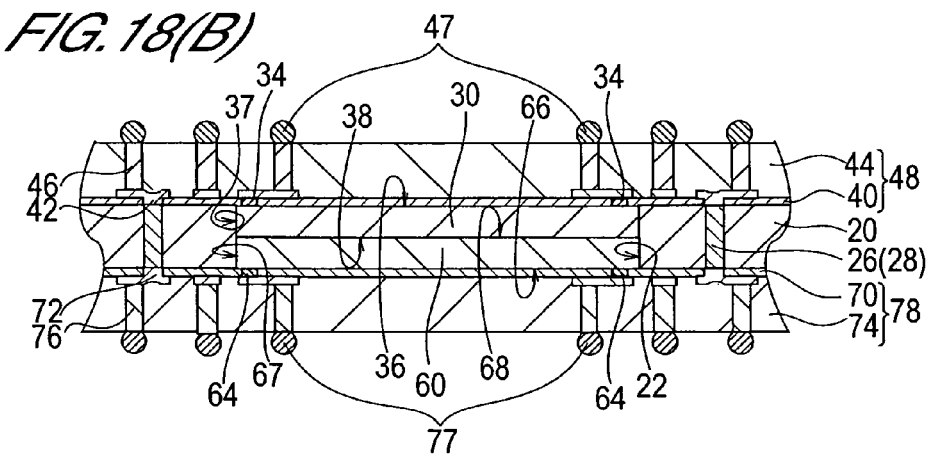

Next, the second sealing portion 74 is formed to cover the surface of the second insulating film 70 on which the second wiring patterns 72 and second electrode posts 76 are formed. Then, as shown in FIG. 18(B), the surfaces of the first and second sealing portions 44 and 74 are trimmed such that the end portions, for example the top surfaces, of the first and second electrode posts 46 and 76 are exposed.

The first and second solder balls 47a, 77a are then formed on the top surfaces of the exposed first and second electrode posts 46 and 76 to serve as first and second external terminals 47 and 77.

Alternatively, the external terminals may be formed with differing shapes, for example constituting the first external terminals 47 with solder balls and the second external terminals 77 as so-called lands.

The first and second external terminals 47 and 77 may be used not only for mounting the semiconductor device on a mounting substrate as described above, but also as terminals for stacking a plurality of the semiconductor devices according to the second embodiment of this invention or other semiconductor devices.

Figure 18C:
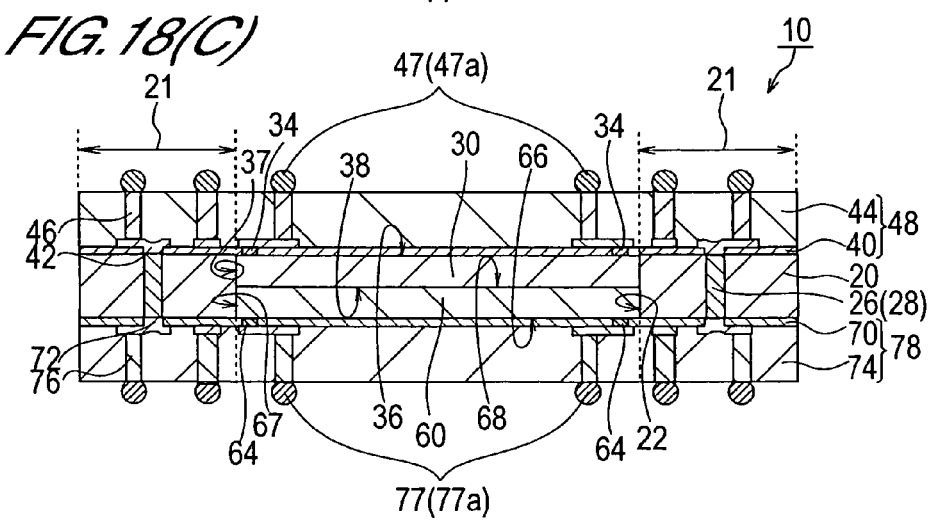

Next, as shown in FIG. 18(C), the plurality of adjacent opening portions 22 are severed to produce individual semiconductor devices comprising the first and second semiconductor chips 30 and 60.

By means of such a process, the semiconductor device 10 of the second embodiment is manufactured.

In this manufacturing method for the semiconductor device of the second embodiment, an example was described in which the processes on the second semiconductor chip 60 side are implemented following the first sealing portion forming step on the first semiconductor chip 30 side. This invention is not limited thereto, however, and the second external terminals 77 may be formed on the second semiconductor chip 60 side following the first external terminal 47 forming step on the first main surface 36 side of the first semiconductor chip 30, for example.

According to the manufacturing method of the second embodiment, a functionally sophisticated, high-speed semiconductor device having two stacked chips can be manufactured by an easy process. Since the jig can be used repeatedly, a reduction in manufacturing costs can be expected. Further, when the base frame and semiconductor chip are suction-held by a suction and exhaust system via a through hole, holding the base frame and semiconductor chip on the jig and removing them therefrom can be performed easily and speedily such that an increase in the throughput of the manufactured semiconductor devices can be expected.

The wiring pattern in the semiconductor device of this invention may be formed in a desired pattern in consideration of the output signals of the semiconductor chips and the disposal positions and so on of the external terminals required in the semiconductor device.

In all embodiments of this invention, the electrode posts 46 are preferably formed from a conductive material. This material is preferably copper. A thin oxidation layer is preferably formed on the surface of the electrode posts 46. In so doing, the adhesive property between the electrode posts 46 and the sealing portion 44 is improved, thereby improving resistance to moisture.

In all embodiments of this invention the solder balls 47*a* are formed on the electrode posts 46 as the external terminals 47. A so-called BGA (Ball Grid Array) has been described, but this invention is not limited thereto. For example, a so-called LGA (Land Grid Array) may be formed by applying and reflow soldering solder paste to the top surface of the exposed electrode posts 46 or implementing Ni/Au processing by means of electroless plating.

More specifically, either the solder layer is formed directly on the top surface of the electrode posts 46, or a barrier metal layer is formed on the top surface of the electrode posts 46 and then a metal (Au) plating layer is formed on the barrier metal layer. Alternatively, the external terminals may be constituted by forming an Sn (tin) layer directly onto the top surface of the electrode posts 46 as a land.

The external terminals 47 may also be directly connected to the wiring pattern 42 without passing through the electrode posts.

In all embodiments of this invention, the sealing portion may be formed not only in a so-called saw-cut form, but may also be formed not matching the profile of the base frame and/or the extension portion as long as the extent of this mismatch is within a range which does not impair the object of this invention.

What is claimed is:

1. A semiconductor device comprising:
   a base frame including a first surface, and a second surface which opposes said first surface, and including an opening portion formed through the base frame;
   a semiconductor chip which includes a first main surface on which a plurality of electrode pads is included and a second main surface opposing said first main surface,
   said semiconductor chip being disposed within said opening portion such that the level of said first main surface is substantially equal to the level of said first surface;
   an insulating film formed on said first surface and said first main surface such that a part of each of said plurality of electrode pads is exposed;
   a plurality of wiring patterns which are electrically connected to said plurality of electrode pads, respectively and which extend from said electrode pads to the upper side of the first surface of said base frame, respectively,
   portions of said wiring patterns on a boundary and vicinity thereof between a region on the upper side of said semiconductor chip and the base frame being wider or thicker than other portions of said wiring patterns;
   a sealing portion formed on said wiring patterns and said insulating film such that a part of each of said wiring patterns is exposed; and
   a plurality of external terminals provided included over said wiring patterns in a region including the upper side of said base frame.

2. The semiconductor device according to claim 1, wherein said external terminals are arranged in a region over the upper side of said first surface at a first pitch wider than a second pitch at which said electrode pads are arranged.

3. The semiconductor device according to claim 1, further comprising a plurality of electrode posts formed between said wiring patterns and said external terminals, wherein said sealing portion is formed such that a top surface of said electrode posts is exposed.

4. The semiconductor device according to claim 3, wherein said electrode posts are made from a conductive material.

5. The semiconductor device according to claim 1, further comprising a lower base for supporting the second main surface of said semiconductor chip and the second surface of said base frame.

6. The semiconductor device according to claim 1, wherein said base frame comprises inside walls which define said opening portion, the thickness of the inside walls gradually decreasing toward said semiconductor chip.

7. The semiconductor device according to claim 1, wherein said base frame comprises a silicon wafer.

8. A semiconductor device comprising:
   a silicon wafer constituting a base frame including a first surface, and a second surface which opposes said first surface, and including an opening portion formed through the base frame;
   a semiconductor chip which includes a first main surface on which a plurality of electrode pads is included and a second main surface opposing said first main surface, said semiconductor chip being disposed within said opening portion such that the level of said first main surface is substantially equal to the level of said first surface;

an insulating film formed on said first surface and said first main surface such that a part of each of said plurality of electrode pads is exposed;

a plurality of wiring patterns which are electrically connected to said plurality of electrode pads, respectively, and which extend from said electrode pads to the upper side of the first surface of said base frame, respectively, a sealing portion formed on said wiring patterns and said insulating film such that a part of each of said wiring patterns is exposed;

a plurality of external terminals included over said wiring patterns in a region including the upper side of said base frame and a plurality of electrode posts formed between said wiring patterns and said external terminals, wherein said sealing portion is formed such that a top suiface of said electrode posts is exposed.

9. The semiconductor device according to claim 8, wherein said external terminals are arranged in a region over the upper side of said first surface at a first pitch wider than a second pitch at which said electrode pads are arranged.

10. The semiconductor device according to claim 8, wherein said electrode posts are made from a conductive material.

11. The semiconductor device according to claim 8, further comprising a lower base for supporting the second main surface of said semiconductor chip and the second surface of said base frame.

12. The semiconductor device according to claim 8, wherein said base frame comprises inside walls which define said opening portion, the thickness of the inside walls gradually decreasing toward said semiconductor chip.

* * * * *